United States Patent
Hiew et al.

(10) Patent No.: US 7,535,719 B2
(45) Date of Patent: May 19, 2009

(54) SINGLE CHIP USB PACKAGES WITH CONTACT-PINS COVER

(75) Inventors: Siew S. Hiew, San Jose, CA (US); Jin Kyu Kim, San Jose, CA (US); Abraham C. Ma, Fremont, CA (US); Ming-Shiang Shen, Taipei Hsien (TW)

(73) Assignee: Super Talent Electronics, Inc., San Jose, CA (US)

(*) Notice: Subject to any disclaimer, the term of this patent is extended or adjusted under 35 U.S.C. 154(b) by 7 days.

(21) Appl. No.: 11/874,174

(22) Filed: Oct. 17, 2007

(65) Prior Publication Data

US 2008/0093720 A1   Apr. 24, 2008

Related U.S. Application Data

(60) Continuation-in-part of application No. 11/624,667, filed on Jan. 18, 2007, which is a division of application No. 09/478,720, filed on Jan. 6, 2000, now Pat. No. 7,257,714.

(51) Int. Cl.
*H05K 1/14* (2006.01)
(52) U.S. Cl. .................. 361/737; 361/727; 361/715
(58) Field of Classification Search ........... 361/727, 361/737, 715, 752, 790, 797, 800, 769; 439/607, 439/374, 79, 379, 610, 680, 131
See application file for complete search history.

(56) References Cited

U.S. PATENT DOCUMENTS 4,582,985 A   4/1986   Lofberg
4,630,201 A   12/1986  White
4,766,293 A   8/1988   Boston
4,926,480 A   5/1990   Chaum (Continued)

FOREIGN PATENT DOCUMENTS

JP          63-163589 A    7/1988

(Continued)

OTHER PUBLICATIONS

USB FlashCard "Main Body Dimensions", "Top View", "Bottom View" Web pages, Lexar, 2004, 3 pages.

(Continued)

*Primary Examiner*—Hung S Bui
(74) *Attorney, Agent, or Firm*—Bever, Hoffman & Harms, LLP; Patrick T. Bever

(57) ABSTRACT

A low-profile Universal-Serial-Bus (USB) assembly includes a modular USB core component that is retractably mounted into an external housing. The modular USB core component includes a PCBA in which all passive components and unpackaged IC chips are attached to a single side of a PCB opposite to the metal contacts. The IC chips (e.g., USB controller, flash memory) are attached to the PCB by wire bonding or other chip-on-board (COB) technique. The passive components are attached by conventional surface mount technology (SMT) techniques. The housing includes a retractable mechanism that facilitates selective exposure of metal contacts, either by sliding a front portion of the modular USB core component into and out of a front opening of the housing, or by providing a cover plate that slidably covers the front portion of the modular USB core component.

20 Claims, 23 Drawing Sheets

U.S. PATENT DOCUMENTS

| | | | |
|---|---|---|---|
| 5,020,105 | A | 5/1991 | Rosen et al. |
| 5,180,901 | A | 1/1993 | Hiramatsu |
| 5,280,527 | A | 1/1994 | Gullman et al. |
| 5,397,857 | A | 3/1995 | Farquhar et al. |
| 5,404,485 | A | 4/1995 | Ban |
| 5,414,597 | A | 5/1995 | Lindland et al. |
| 5,430,859 | A | 7/1995 | Norman et al. |
| 5,479,638 | A | 12/1995 | Assar et al. |
| 5,623,552 | A | 4/1997 | Lane |
| 5,835,760 | A | 11/1998 | Harmer |
| 5,959,541 | A | 9/1999 | DiMaria et al. |
| 6,000,006 | A | 12/1999 | Bruce et al. |
| 6,012,636 | A | 1/2000 | Smith |
| 6,044,428 | A | 3/2000 | Rayabhari |
| 6,069,920 | A | 5/2000 | Schulz et al. |
| 6,069,970 | A | 5/2000 | Salatino et al. |
| 6,125,192 | A | 9/2000 | Bjorn et al. |
| 6,148,354 | A | 11/2000 | Ban et al. |
| 6,193,152 | B1 | 2/2001 | Fernando et al. |
| 6,292,863 | B1 | 9/2001 | Terasaki et al. |
| 6,297,448 | B1 | 10/2001 | Hara |
| 6,313,400 | B1 | 11/2001 | Mosquera et al. |
| 6,321,478 | B1 | 11/2001 | Klebes |
| 6,438,638 | B1 | 8/2002 | Jones et al. |
| 6,475,830 | B1 | 11/2002 | Brillhart |
| 6,615,404 | B1 | 9/2003 | Garfunkel et al. |
| 6,618,243 | B1 | 9/2003 | Tirosh |
| 6,624,005 | B1 | 9/2003 | DiCaprio et al. |
| 6,671,808 | B1 | 12/2003 | Abbott et al. |
| 6,676,420 | B1 | 1/2004 | Liu et al. |
| 6,718,407 | B2 | 4/2004 | Martwick |
| 6,733,329 | B2 | 5/2004 | Yang |
| 6,757,783 | B2 | 6/2004 | Koh |
| 6,763,410 | B2 | 7/2004 | Yu |
| 6,773,192 | B1 | 8/2004 | Chao |
| 6,778,401 | B1 | 8/2004 | Yu et al. |
| 6,832,281 | B2 | 12/2004 | Jones et al. |
| 6,854,984 | B1 | 2/2005 | Lee et al. |
| 6,900,988 | B2 | 5/2005 | Yen |
| 6,940,153 | B2 | 9/2005 | Spencer et al. |
| 6,944,028 | B1 | 9/2005 | Yu et al. |
| 6,979,210 | B2 * | 12/2005 | Regen et al. ............... 439/131 |
| 7,004,780 | B1 * | 2/2006 | Wang ......................... 439/353 |
| 7,153,148 | B2 * | 12/2006 | Chen et al. ................. 439/141 |
| 7,361,032 | B2 * | 4/2008 | Loftus ......................... 439/131 |
| 7,416,419 | B2 * | 8/2008 | Collantes et al. ........... 439/76.1 |
| 7,422,454 | B1 * | 9/2008 | Tang et al. .................. 439/131 |
| 2001/0038547 | A1 | 11/2001 | Jigour et al. |
| 2001/0043174 | A1 | 11/2001 | Jacobsen et al. |
| 2002/0036922 | A1 | 3/2002 | Roohparvar |
| 2002/0116668 | A1 | 8/2002 | Chhor et al. |
| 2002/0166023 | A1 | 11/2002 | Nolan et al. |
| 2003/0038043 | A1 | 2/2003 | Painsith |
| 2003/0046510 | A1 | 3/2003 | North |
| 2003/0100203 | A1 | 5/2003 | Yen |
| 2003/0163656 | A1 | 8/2003 | Ganton |
| 2003/0177300 | A1 | 9/2003 | Lee et al. |
| 2003/0182528 | A1 | 9/2003 | Ajiro |
| 2004/0034765 | A1 | 2/2004 | James |
| 2004/0066693 | A1 | 4/2004 | Osako |
| 2004/0087213 | A1 | 5/2004 | Kao |
| 2004/0137664 | A1 | 7/2004 | Elazar et al. |
| 2004/0143716 | A1 | 7/2004 | Hong |
| 2004/0145875 | A1 | 7/2004 | Yu et al. |
| 2004/0148482 | A1 | 7/2004 | Grundy et al. |
| 2004/0153595 | A1 | 8/2004 | Sukegawa et al. |
| 2004/0255054 | A1 | 12/2004 | Pua et al. |
| 2005/0009388 | A1 | 1/2005 | Chao |
| 2005/0114587 | A1 | 5/2005 | Chou et al. |
| 2005/0182858 | A1 | 8/2005 | Lo et al. |
| 2005/0193161 | A1 | 9/2005 | Lee et al. |
| 2005/0193162 | A1 | 9/2005 | Chou et al. |
| 2005/0216624 | A1 | 9/2005 | Deng et al. |
| 2005/0218200 | A1 | 10/2005 | Focke et al. |
| 2005/0248926 | A1 | 11/2005 | Asom et al. |

FOREIGN PATENT DOCUMENTS

| | | |
|---|---|---|
| JP | 02-118790 A | 5/1990 |
| JP | 11-039483 | 2/1999 |

OTHER PUBLICATIONS

USB 'A' Plug Form Factor, Revision 0.9, Guideline for Embedded USB Device Applications, Nov. 29, 2004, 4 pages.

* cited by examiner

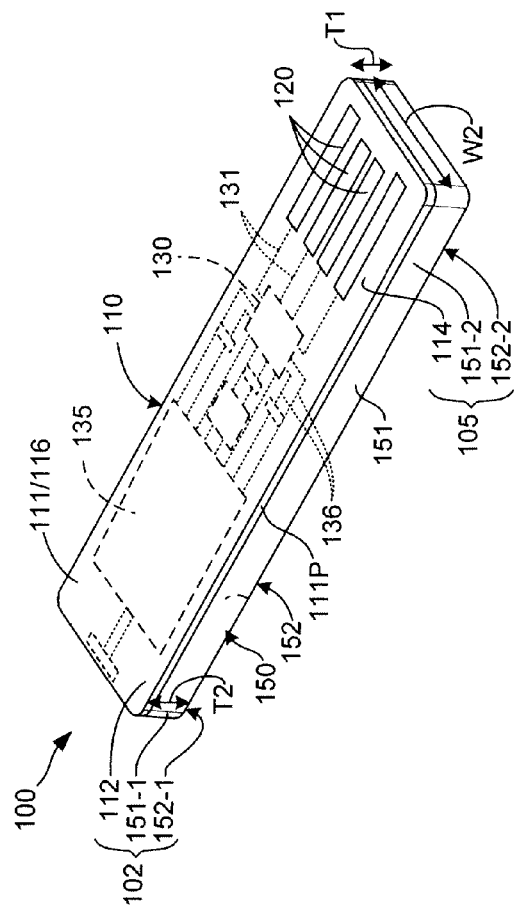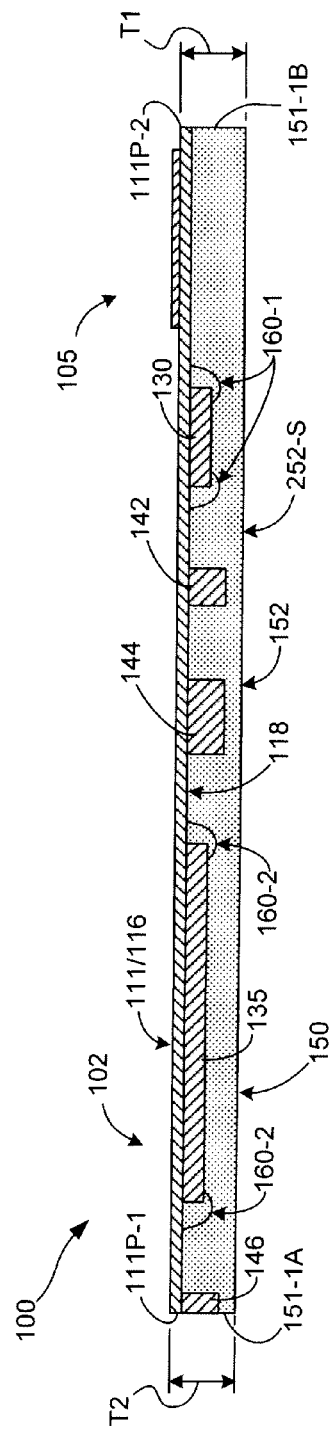
FIG. 2(A)
FIG. 2(B)

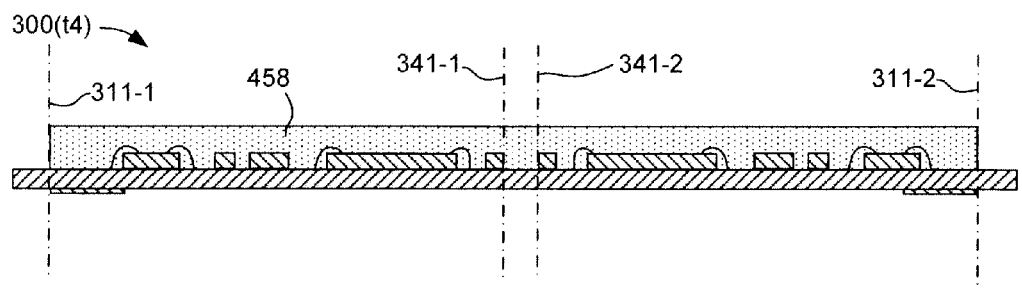
FIG. 15
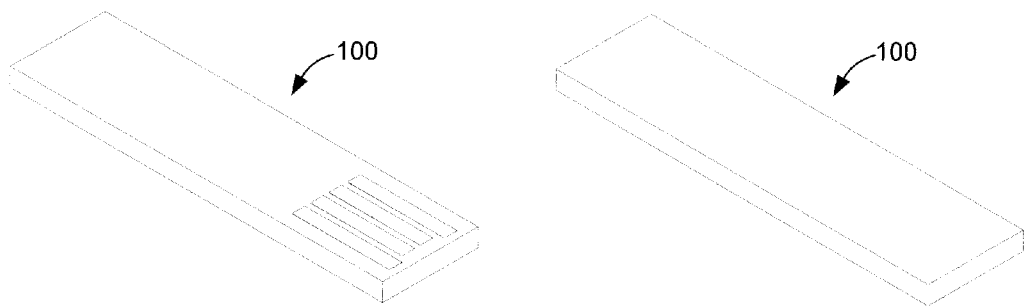
FIG. 16(A)         FIG. 16(B)
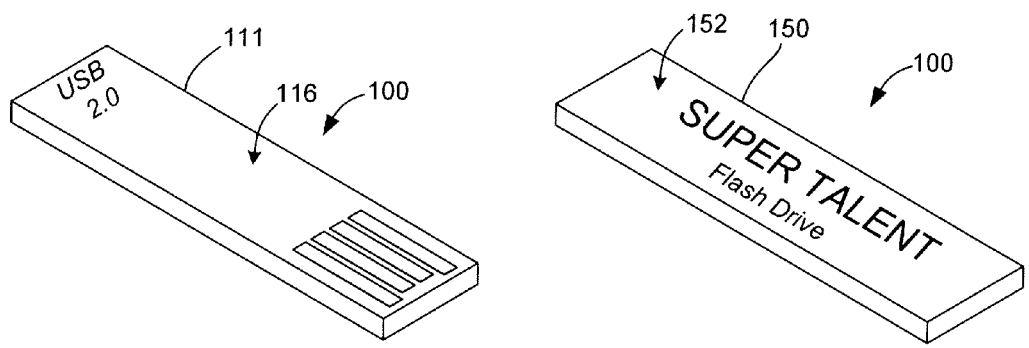
FIG. 17(A)         FIG. 17(B)

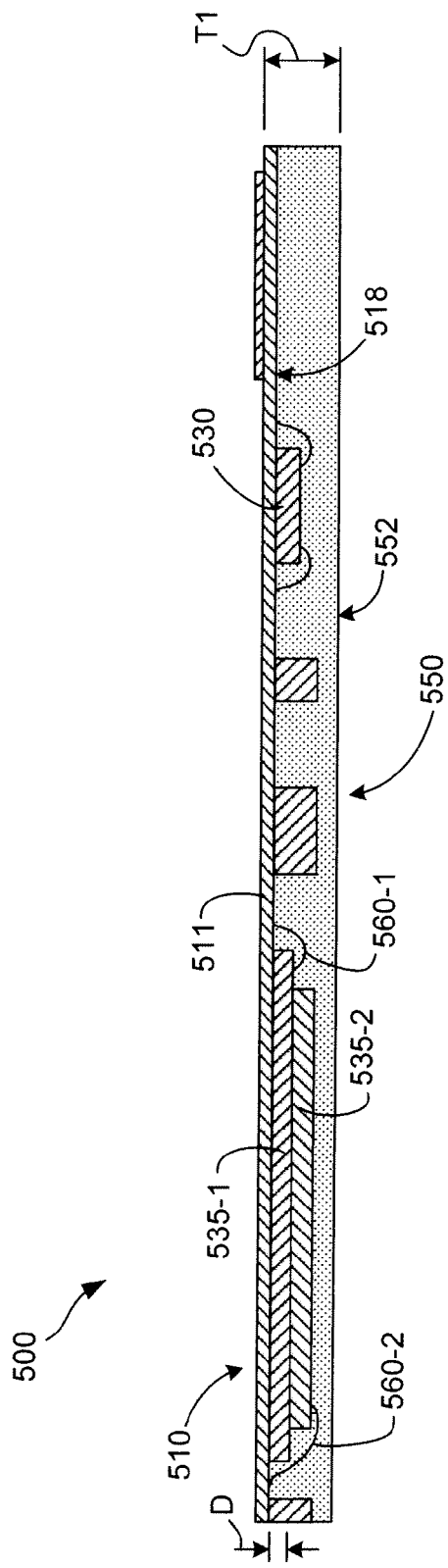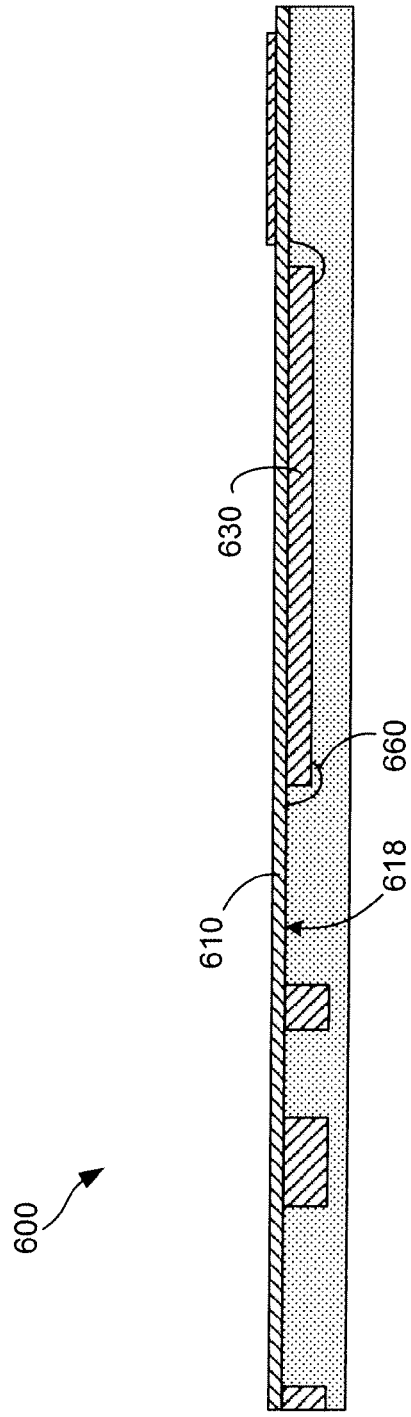
FIG. 18
FIG. 19

SINGLE CHIP USB PACKAGES WITH CONTACT-PINS COVER

RELATED APPLICATIONS

This application is a continuation-in-part (CIP) of U.S. Patent application for "Electronic Data Storage Medium with Fingerprint Verification Capability", U.S. application Ser. No. 11/624,667, filed Jan. 18, 2007, which is a divisional of U.S. Patent application for "Electronic Data Storage Medium with Fingerprint Verification Capability", U.S. application Ser. No. 09/478,720 filed Jan. 6, 2000, now U.S. Pat. No. 7,257,714.

This application is also a CIP of U.S. Patent application for "Molding Methods To Manufacture Single-Chip Chip-On-Board USB Device" U.S. application Ser. No. 11/773,830, filed Jul. 5, 2007, which is a CIP of U.S. Patent application for "Low-Profile USB Device", U.S. application Ser. No. 11/112,501, filed on Apr. 21, 2005 now U.S. Pat. No. 7,269,004.

FIELD OF THE INVENTION

This invention relates to portable electronic devices, and more particularly to portable electronic devices such as those that utilize the Universal-Serial-Bus (USB) specification.

BACKGROUND OF THE INVENTION

In the past, confidential data files were stored in floppy disks or were delivered via networks that require passwords or that use encryption coding for security. Confidential documents can be sent by adding safety seals and impressions during delivering. However, the aforesaid are exposed to the risks of breaking of the passwords, encryption codes, safety seals and impressions, thereby resulting in unsecure transfer of information.

More recently, there is an ongoing trend towards the use of miniaturized, portable computer peripheral devices to store confidential data. In certain cases, such peripheral devices have been reduced to "pocket size", meaning that they can literally be carried in a user's pocket in the same manner as a wallet or set of keys. One example of particular interest, in which context the present invention will be described herein, is a "flash disk", or "Universal Serial Bus (USB) flash drive".

The proliferation of portable computer peripheral devices, such as USB flash drives, has made the production of USB flash drives very cost sensitive. For example, there is currently a strong demand for high quality USB devices that are very low in cost. Accordingly, there is an ever increasing need for computer peripheral devices that are reliable and inexpensive to produce.

What is needed is a portable computer peripheral device that overcomes the problems associated with conventional structures. What is particularly needed is a high quality USB device that has a very low production cost.

SUMMARY OF THE INVENTION

The present invention is directed to high quality retractable low-profile USB devices (or other electronic data storage medium) that include an external case that is mounted or otherwise formed over a modular USB core component such that the modular USB core component is selectively exposed for access by a data terminal by way of a retractable mechanism. The modular USB component includes a card body (i.e., a printed circuit board assembly (PCBA)) and a single-piece molded housing that encases all passive components and integrated circuit (IC) components of the PCBA, which include a non-volatile memory device, a card reader interface circuit and a processing unit (e.g., a USB controller) that are implemented using one or more integrated circuit (IC) die(s) mounted on said card body. All of the components encased by the single-piece molded housing are formed on a selected surface of the card body, and standard USB metal contacts are disposed on an opposing surface that is exposed outside of the molded housing (i.e., the components are only mounted on a side of the card body that is opposite to the metal contacts). The housing is disposed around at least a portion of the modular USB core component such that the metal contacts are disposed adjacent to a front opening defined in the housing (i.e., the metal contacts are retracted just inside the front opening or fixedly positioned just outside the front opening). A retractable mechanism is slidably connected to the housing and manually movable between a (first) "transport" position in which the metal contacts are protected from damage, and a (second) deployed position in which the metal contacts are exposed for access by the data terminal. By providing several such housings, where each housing is configured to receive the modular USB core component, the present invention facilitates the production of a wide range of retractable low-profile USB assemblies in an inexpensive manner.

According to an aspect of the invention, passive components are mounted onto the PCB using one or more standard surface mount technology (SMT) techniques, and one or more IC die (e.g., an USB controller IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce modular USB core components, the present invention provides several advantages over conventional manufacturing methods that utilize SMT techniques only. First, by utilizing COB techniques to mount the USB controller and flash memory, the large PCB area typically taken up by SMT-packaged controllers and flash devices is dramatically reduced, thereby facilitating significant miniaturization of the resulting USB device footprint (i.e., providing a shorter device length and thinner device width). Second, the IC die height is greatly reduced, thereby facilitating stacked memory arrangements that greatly increase memory capacity of the USB devices without increasing the USB device footprint. Further, overall manufacturing costs are reduced by utilizing unpackaged controllers and flash devices (i.e., by eliminating the cost associated with SMT-package normally provided on the controllers and flash devices). Moreover, the molded housing provides greater moisture and water resistance and higher impact force resistance than that achieved using conventional manufacturing methods. Therefore, the combined COB and SMT method according to the present invention provides a less expensive and higher quality (i.e., more reliable) memory product with a smaller size than that possible using conventional SMT-only manufacturing methods.

According to an embodiment of the invention, a modular USB core component utilizes a single-chip controller/flash die that includes both a controller circuit and one or more flash block mass storage circuits that are interconnected by a bus. The controller circuit includes an input/output (I/O) interface circuit that facilitates sending and receiving commands and data to/from a host, and a flash-memory controller that facilitates sending and receiving sends data over the internal bus to/from the flash mass storage blocks. By combining the controller and flash memory circuits, external pins are not required, thereby further reducing the PCB area required for controller and flash memory devices, thus facilitating further miniaturization of USB devices formed in accordance with the present invention.

According to first series of specific embodiments of the invention, the retractable mechanism of the retractable USB assemblies includes a holder that is slidably disposed in a housing with the modular USB core component mounted thereon. The housing includes peripheral walls that define a central trough into which the modular USB core component is mounted. When the holder is retracted inside the housing a front wall of the holder blocks the front opening of the housing and an upper (or lower) wall of the housing covers the metal contacts of the modular USB core component. Conversely, when the holder is deployed, a front portion of the holder extends through the front opening of the housing such that the metal contacts of the modular USB core component are exposed for access by the data terminal.

According to second series of specific embodiments of the invention, the modular USB core component is fixedly received in the housing, and the retractable mechanism includes a cover plate that is slidably disposed in the housing such that the cover plate is slidable between a closed position, in which the cover plate is disposed over the metal contacts of the modular USB core component, and an open position, in which the cover plate is disposed inside the housing and the metal contacts of the modular USB core component are exposed for access by the data terminal.

Thus, the present invention facilitates the production of low-cost, highly reliable, high capacity retractable USB apparatus having aesthetic casing designs that easily and conveniently incorporate the short, modular USB core component.

BRIEF DESCRIPTION OF THE DRAWINGS

These and other features, aspects and advantages of the present invention will become better understood with regard to the following description, appended claims, and accompanying drawings, where:

FIGS. 2(A) and 2(B) are perspective top and cross sectional side views showing an exemplary modular USB device according to an embodiment of the present invention;

FIG. 15 is simplified cross-sectional side view depicting a singulation process for separating the PCB panel of FIG. 4(B) into individual USB devices according to the method of FIG. 3;

FIGS. 16(A) and 16(B) are bottom and top perspective views showing USB devices after the singulation process of FIG. 3 is completed;

FIGS. 17(A) and 17(B) are bottom and top perspective views showing the modular USB device of FIG. 16(A) after a marking process is performed in accordance with the method of FIG. 3;

FIG. 18 is simplified cross-sectional side view showing a modular USB device including stacked-memory according to another embodiment of the present invention;

FIG. 19 is simplified cross-sectional side view showing a single-chip modular USB device according to another embodiment of the present invention;

DETAILED DESCRIPTION OF THE DRAWINGS

The present invention relates to an improved method for manufacturing USB devices, and in particular to USB assemblies manufactured by the method. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
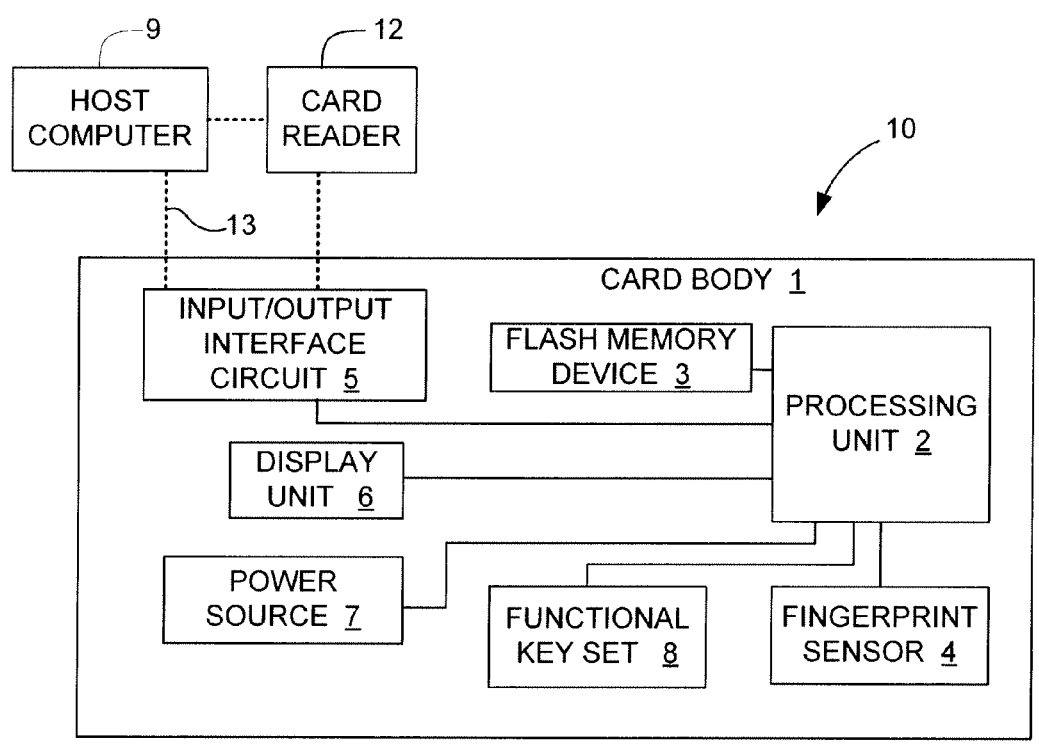
FIG. 1 is a schematic circuit block diagram illustrating an electronic data storage medium according an embodiment of the present invention.

Referring to FIG. 1, according to an embodiment of the present invention, an electronic data storage card 10 is adapted to be accessed by an external (host) computer 9 either via an optional card reader 12 or other interface mechanism, and includes a card body 1, a processing unit 2, one or more flash memory devices 3, a fingerprint sensor 4, an input/output interface circuit 5, an optional display unit 6, a power source (e.g., battery) 7, and a function key set 8.

Flash memory device 3 is mounted on the card body 1, and stores in a known manner therein a data file, a reference password, and fingerprint reference data obtained by scanning a fingerprint of a person authorized to access the data file. The data file can be a picture file or a text file.

The fingerprint sensor 4 is mounted on the card body 1, and is adapted to scan a fingerprint of a user of electronic data storage card 10 and to generate fingerprint scan data. One example of the fingerprint sensor 4 that can be used in the present invention is that disclosed in a co-owned U.S. Pat. No. 6,547,130, entitled "INTEGRATED CIRCUIT CARD WITH FINGERPRINT VERIFICATION CAPABILITY", the entire disclosure of which is incorporated herein by reference. The fingerprint sensor described in the above patent includes an array of scan cells that defines a fingerprint scanning area. The fingerprint scan data includes a plurality of scan line data obtained by scanning corresponding lines of array of scan cells. The lines of array of scan cells are scanned in a row direction as well as column direction of said array. Each of the scan cells generates a first logic signal upon detection of a ridge in the fingerprint of the holder of card body, and a second logic signal upon detection of a valley in the fingerprint of the holder of card body.

The input/output interface circuit 5 is mounted on the card body 1, and is activable so as to establish communication with the external computer 9 by way of an optional card reader 12 or via an appropriate socket. In one embodiment, input/output interface circuit 5 includes circuits and control logic associated with an Universal Serial Bus (USB), PCMCIA or RS232 interface structure that is connectable to an associated socket connected to or mounted on host computer 9. In another embodiment, input/output interface circuit 5 may include one of a Secure Digital (SD) interface circuit, a Multi-media Card (MMC) interface circuit, a CompactFlash (CF) interface circuit, a Memory Stick (MS) interface circuit, a PCI-Express interface circuit, a Integrated Drive Electronics (IDE) interface circuit, and a Serial Advanced Technology Attachment (SATA) interface circuit, which interface with host computer 9 via optional card reader 12 according to known techniques.

The processing unit 2 is mounted on the card body 1, and is connected to the memory device 3, the fingerprint sensor 4 and the input/output interface circuit 5 by way of associated conductive traces or wires disposed on card body 1. In one embodiment, processing unit 2 is one of an 8051, 8052, 80286 microprocessor available, for example, from Intel Corporation. In other embodiments, processing unit 2 includes a RISC, ARM, MIPS or other digital signal processor. In accordance with an aspect of the present invention, processing unit 2 is controlled by a program stored at least partially in flash memory device 3 such that processing unit 2 is operable selectively in: (1) a programming mode, where the processing unit 2 activates the input/output interface circuit 5 to receive the data file and the fingerprint reference data from the host computer 9, and to store the data file and the fingerprint reference data in the memory device 3 in a compressed format to increase storage capacity of the memory device 3; (2) a data retrieving mode, where the processing unit 2 receives the fingerprint scan data from the fingerprint sensor 4, compares the fingerprint scan data with at least a segment of the fingerprint reference data in the memory device 3 to verify if the user of the electronic data storage card is authorized to access the data file stored in the memory device 3, and activates the input/output interface circuit 5 to transmit the data file to the host computer 9 upon verifying that the user of the electronic data storage card is authorized to access the data file stored in the memory device 3; and (3) a data resetting mode, where the data file and the finger reference data are erased from the memory device 3. In operation, host computer 9 sends write and read requests to electronic data flash card 10 via optional card reader 12 and input/output interface circuit 5 to the processing unit 2, which in turn utilizes a flash memory controller (not shown) to read from or write to the associated one or more flash memory device 3. In one embodiment, the processing unit 2 automatically initiates operation in the data resetting mode upon detecting that a preset time period has elapsed since storage of the data file and the fingerprint reference data in the memory device 3.

The optional power source 7 is mounted on the card body 1, and is connected to the processing unit 2 for supplying electrical power thereto.

The function key set 8, which is mounted on the card body 1, is connected to the processing unit 2, and is operable so as to initiate operation of the processing unit 2 in a selected one of the programming, data retrieving and data resetting modes. The function key set 8 is operable to provide an input password to the processing unit 2. The processing unit 2 compares the input password with the reference password in the flash memory device 3, and initiates operation in the data resetting mode upon verifying that the input password corresponds with the reference password.

The optional display unit 6 is mounted on the card body 1, and is connected to and controlled by the processing unit 2 for showing the data file exchanged with the external computer 9 and the operating status of electronic data storage card 10.

As set forth in the specific embodiments below, the present invention is directed to portable computer peripheral devices that are connected by plug connectors to host computer systems (e.g., computer 9; see FIG. 1) to perform the programming, data retrieving and data resetting functions similar to those described above. In particular, as described below with reference to the embodiments shown in FIGS. 2-28, the present invention is directed to peripheral devices in which a modular Universal-Serial-Bus (USB) core component 10 is formed that can be inserted into any of a number of different housings, thereby facilitating the production of a wide range of USB device assemblies in an inexpensive manner. At least some of the components of electronic data storage card 10 (e.g., card body (PCB) 1, processing unit 2, non-volatile memory device 3 and card reader interface circuit 5) are implemented in the embodiment described below using USB equivalent circuits.

FIGS. 2(A) and 2(B) are perspective and cross-sectional side views showing an exemplary modular USB core component 100 that is utilized in the manufacture of USB assemblies according to the present invention. USB core component 100 generally includes a printed circuit board assembly (PCBA) 110 and a plastic housing 150 that is molded onto PCBA 110. Referring to the upper portion of FIG. 2(A), PCBA 110 includes a printed circuit board (PCB) 111 including a PCB handle section 112 at a rear end of PCB 111, and a PCB plug section 114 at a front end of PCB 111. PCB 111 is a substantially flat substrate, and has opposing sides that are referred to below as upper (first) surface 116 and lower (second) surface 118. Formed on upper surface 116 in plug section 114 are four metal contacts 120. Metal contacts 120 are shaped and arranged in a pattern established by the USB specification. PCB 111 is formed in accordance with known PCB manufacturing techniques such that metal contacts 120, IC dies 130 and 135, and passive components 142, 144 and 146 are electrically interconnected by a predefined network including conductive traces 131 and 136 and other conducting structures that are sandwiched between multiple layers of an insulating material (e.g., FR4) and adhesive.

According to an aspect of the invention, passive components are mounted onto lower surface 118 using one or more standard surface mount technology (SMT) techniques, and one or more integrated circuit (IC) die (e.g., control IC die 130 and flash memory die 135) are mounted using chip-on-board (COB) techniques. As indicated in FIG. 2(B), during the SMT process, the passive components, such as capacitors 142, oscillator 144 and a light emitting diode 146, are mounted onto contact pads (described below) disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 118 and electrically connected to corresponding contact pads using known COB techniques. For example, as indicated in FIG. 2(B), control IC die 130 is electrically connected to PCB 111 by way of wire bonds 160-1 that are formed using known techniques. Similarly, flash memory IC die 135 is electrically connected to PCB 111 by way of wire bonds 160-2. Passive components 142, 144, 146, IC dies 130 and 135 and metal contacts 120 are operably interconnected by way of metal traces 131 and 136 that are formed on and in PCB 111 using known techniques, a few of which being depicted in FIG. 2(A) in a simplified manner by short dashed lines.

Housing 150 comprises molded plastic arranged such that substantially all of the plastic used to form housing 150 is located below (i.e., on one side of) PCB 111. Housing 150 includes a peripheral surface 151 extending downward (i.e., perpendicular to PCB 111), and a lower surface 152 that extends parallel to PCB 111. For discussion purposes, the portion of peripheral surface 151 surrounding handle section 112 of PCB 111 is referred to below as handle surface section 151-1, and the section of peripheral surface 151 surrounding plug section 114 of PCB 111 is referred to below as plug surface section 151-2. Similarly, the portion of lower surface 152 covering handle section 112 of PCB 111 is referred to below as handle surface section 152-1, and the section of lower surface 152 covering plug section 114 of PCB 111 is referred to below as plug cover section 152-2.

Referring again to FIG. 2(A), a handle structure 102 of USB core component 100 is defined by handle surface section 151-1, handle surface section 152-1, and the exposed upper surface 116 of PCB handle section 112. Similarly, a plug structure 105 of Modular USB core component 100 is defined by plug surface section 151-2, plug surface section 152-2, and the exposed upper surface 116 of PCB plug section 114.

Referring to FIGS. 2(A) and 2(B), a thickness T1 and width W1 of plug structure 105 is selected to produce a secure (snug) fit inside the plug portion of an external case (discussed below).

As indicated in FIG. 2(B), according to another aspect of the present invention, housing 150 includes a planar surface 152 that is parallel to PCB 111, and defines a single plane such that a first thickness T1 of plug structure 105 (i.e., measured between upper PCB surface 116 and planar surface 152 adjacent to metal contacts 120) is substantially equal to a second thickness T2 of handle section 102 (i.e., measured between upper PCB surface 116 and planar surface 152 adjacent to IC 135. That is, as indicated in FIG. 2(B), modular USB core component 100 is substantially flat along its entire length (i.e., from rear edge 151-1A to front edge 151-1B). The term "substantially flat" is meant to indicate that planar surface 152 is substantially parallel to an uppermost surface of modular USB core component 100 along its entire length. In the embodiment shown in FIGS. 2(A) and 2(B), the uppermost surface of modular USB core component 100 is defined in part by upper surface 116 of PCB 111, which is parallel to planar surface 152 along the entire length of USB core component 100. Similarly, the term "substantially flat" is also intended to cover embodiments described below in which the housing includes a thin wall structure that is formed on or otherwise contacts the upper surface of the PCB. In these embodiments, the thickness T2 of handle structure 102 may differ by a small amount (e.g., 5% from thickness T1 of plug structure 105.)

According to an aspect of the present invention, the "flatness" associated with modular USB core component 100 is achieved by mounting all of the IC dies ("chips") and other electronic components of modular USB core component 100 on lower surface 118 of PCB 111 (i.e., on the side opposite to metal contacts 120). That is, the minimum overall thickness of modular USB core component 100 is determined by the thickness T1 that is required to maintain a snug connection between plug structure 105 and female USB socket connector (not shown). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of modular USB core component 100 can be minimized by mounting the IC dies 130 and 135 and passive components (e.g., capacitor 142) only on lower surface 118 of PCB 111. That is, if the IC dies and passive components are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIGS. 2(A) and 2(B), upper surface 116 of PCB 111 is entirely exposed on the upper surface of modular USB core component 100, thus facilitating the production of USB core component 100 with a maximum thickness equal to thickness T1 of plug structure 105. That is, because metal contacts 120 are formed on upper surface 116, and upper surface 116 defines the higher end of required plug structure thickness T1, the overall height of modular USB core component 100 can be minimized by exposing upper surface 116 (i.e., by making any point on upper PCB surface 116 the uppermost point of modular USB core component 100). As indicated in FIG. 2(A), in accordance with feature specifically associated with modular USB core component 100, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

Figure 3:
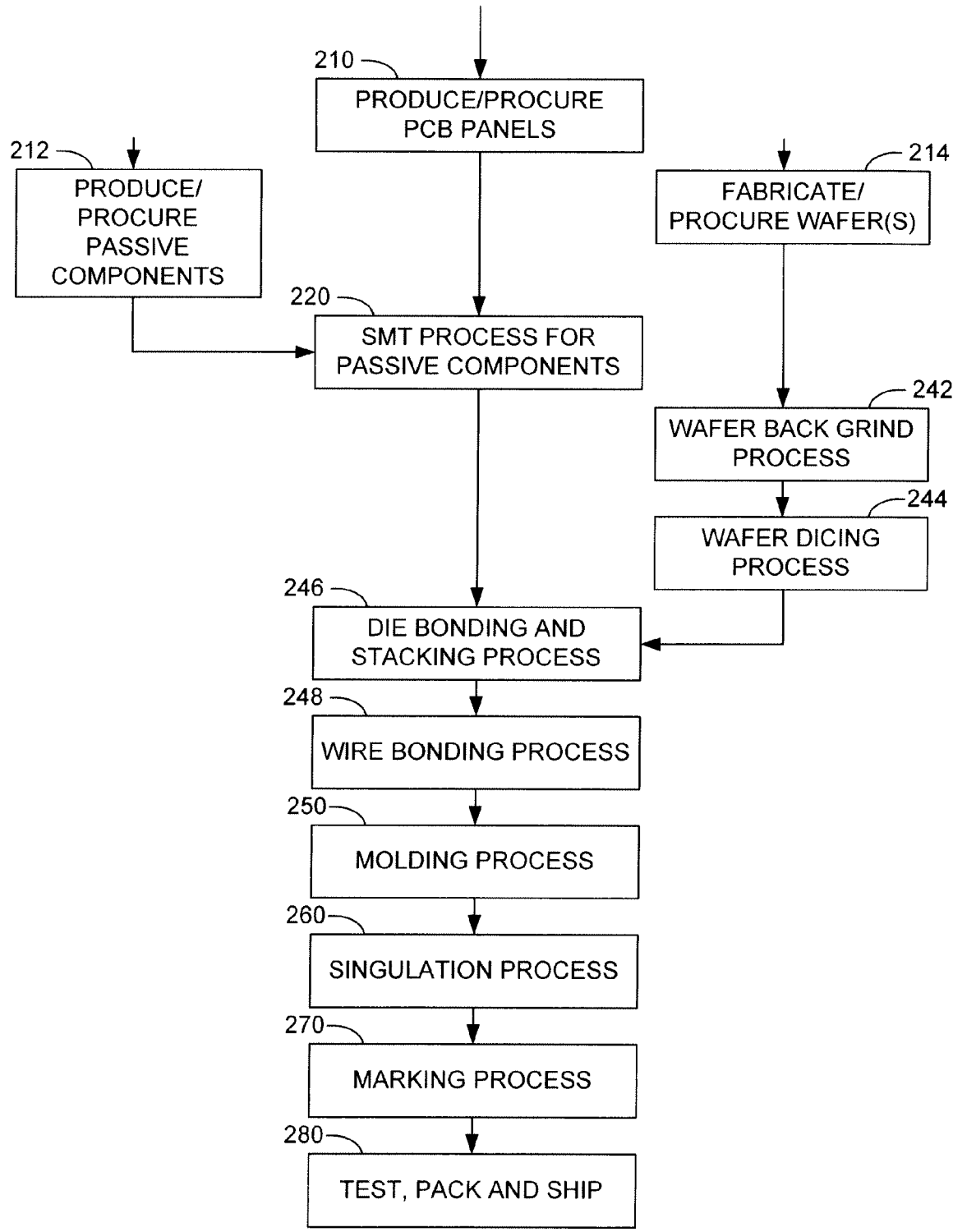
FIG. 3 is a flow diagram showing a method for producing the modular USB device of FIGS. 2(A) and 2(B) according to another embodiment of the present invention.

FIG. 3 is a flow diagram showing a method for producing modular USB core component 100 according to another embodiment of the present invention. Summarizing the novel method, a PCB panel is generated using known techniques (block 210), passive components are mounted on the PCB panel using SMT techniques (block 220), and the IC dies are die bonded (block 246) and wire bonded (block 248) using known COB techniques. Molten plastic is then used to form a molded housing over the passive components and the IC dies (block 250). Then PCB panel is then singulated (cut) in to separate USB devices (block 260), the individual USB devices are marked (block 270), and then the USB devices are tested, packed and shipped (block 280) according to customary practices. This method provides several advantages over conventional manufacturing methods that utilize SMT techniques only. First, by utilizing COB techniques to mount the USB controller and flash memory, the large amount of space typically taken up by these devices is dramatically reduced, thereby facilitating significant miniaturization of the resulting USB device footprint. Second, by implementing the wafer grinding methods described below, the die height is greatly reduced, thereby facilitating stacked memory arrangements such as those described below with reference to FIG. 18. The molded housing also provides greater moisture and water resistance and higher impact force resistance than that achieved using conventional manufacturing methods. In comparison to the standard USB memory card manufacturing that used SMT process, it is cheaper to use the combined COB and SMT (plus molding) processes described herein because, in the SMT-only manufacturing process, the bill of materials such as Flash memory and the Controller chip are also manufactured by COB process, so all the COB costs are already factored into the packaged memory chip and controller chip. Therefore, the combined COB and SMT method according to the present invention provides a less expensive and higher quality (i.e., more reliable) memory product with a smaller size than that possible using conventional SMT-only manufacturing methods.

The flow diagram of FIG. 3 will now be described in additional detail below with reference to FIGS. 4(A) to 17(B).

Referring to the upper portion of FIG. 3, the manufacturing method begins with filling a bill of materials including producing/procuring PCB panels (block 210), producing/procuring passive (discrete) components (block 212) such as resistors, capacitors, diodes, LEDs and oscillators that are packaged for SMT processing, and producing/procuring a supply of IC wafers (or individual IC dies).

Figure 4A:
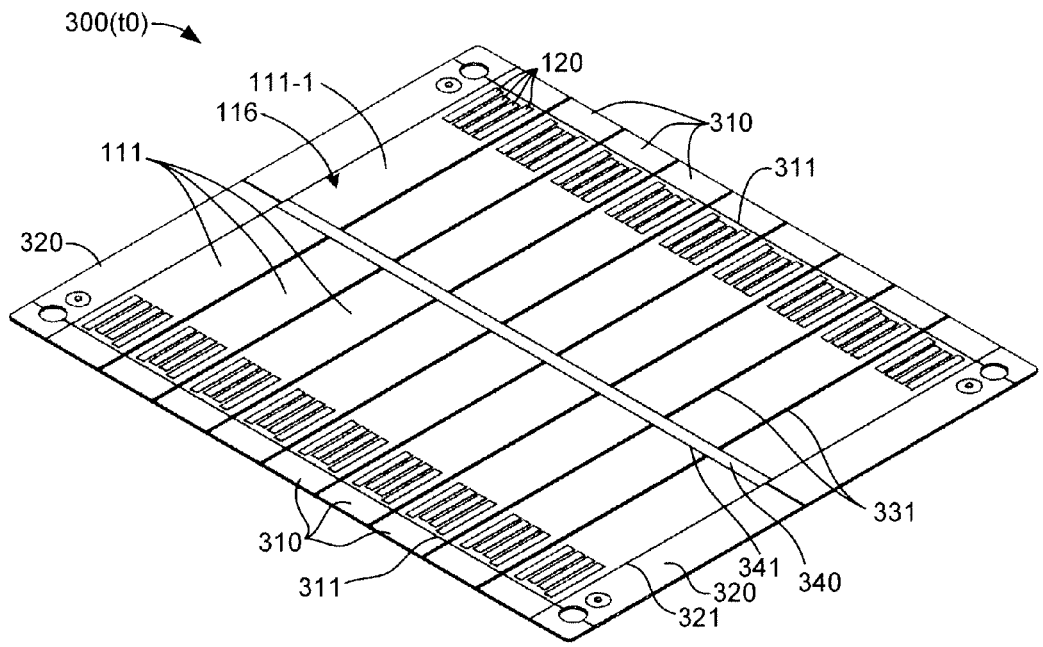
FIGS. 4(A) and 4(B) are bottom and top perspective views showing a PCB panel utilized in the method of FIG. 3.
Figure 4B:
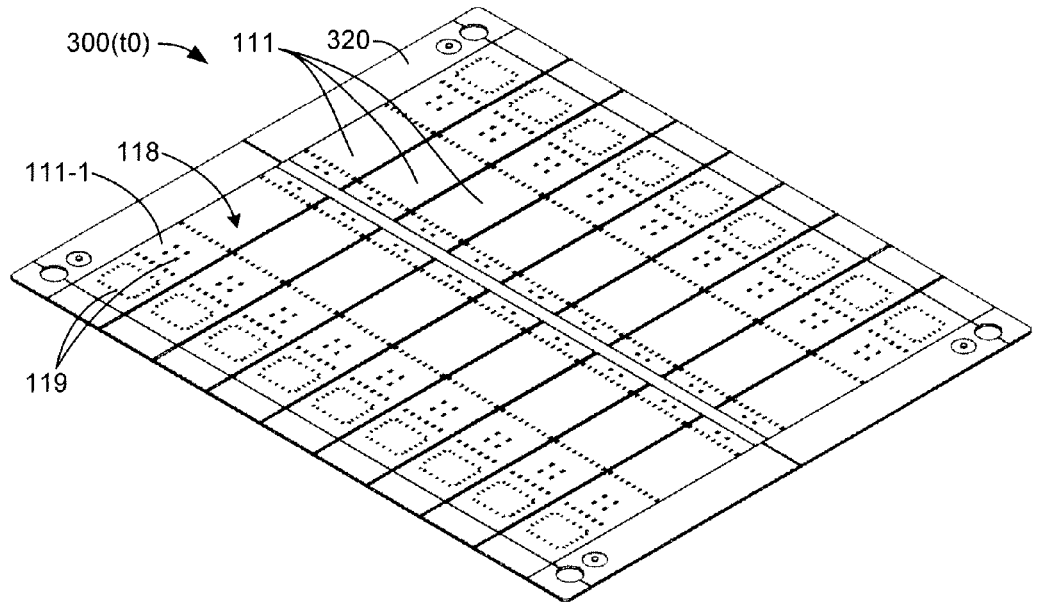

FIGS. 4(A) and 4(B) are top and bottom perspective views, respectively, showing a PCB panel 300(t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIGS. 4(A) and 4(B), PCB panel 300(t0) includes a two-by-nine matrix of regions designated as PCBs 111, each having the features described above with reference to FIGS. 2(A) and 2(B). FIG. 4(A) shows upper surface 116 of each PCB 111 (e.g., upper surface 116 of panel 111-1 includes metal contacts 120), and FIG. 4(B) shows lower surface 118 of each PCB 111. Note that lower surface 118 of each PCB 111 (e.g., PCB 111-1) includes multiple contact pads 119 arranged in predetermined patterns for facilitating SMT and COB processes, as described below.

As indicated in FIG. 4(A), in addition to the two rows of PCBs 111, panel 300(t0) includes end border regions 310 and side border regions 320 that surround the PCBs 111, and a central region 340 disposed between the two rows of PCBs 111. Designated cut lines are scored or otherwise partially cut into PCB panel 300(t0) along the borders of each of these regions, but do not pass through the panel material. For example, end cut lines 311 separate end border panels 310 from associated PCBs 111, side cut lines 321 separate side border panels 310 from associated PCBs 111, and central cut lines 341 separate central region 340 from associated PCBs 111. PCB cut lines 331 are formed along the side edges between adjacent PCBs 111. The border panels are provided with positioning holes and other features known to those skilled in the art to facilitate the manufacturing process, and are removed during singulation (described below).

Note that PCBs for USB devices that are produced using SMT-only manufacturing processes must be significantly wider than PCBs 111 due to the space required to mount already packaged flash memory devices. As such, PCB panels for SMT-only manufacturing methods typically include only twelve PCBs arranged in a 2×6 matrix. By utilizing COB methods to mount the flash memory, the present invention facilitates significantly narrower PCB 111, thereby allowing each PCB panel 300(t0) to include 18 PCBs 111 arranged in a 2×9 matrix. By increasing the number of PCBs 111 per PCB panel, the present invention provides shorter manufacturing time and hence lower cost.

Figure 5:
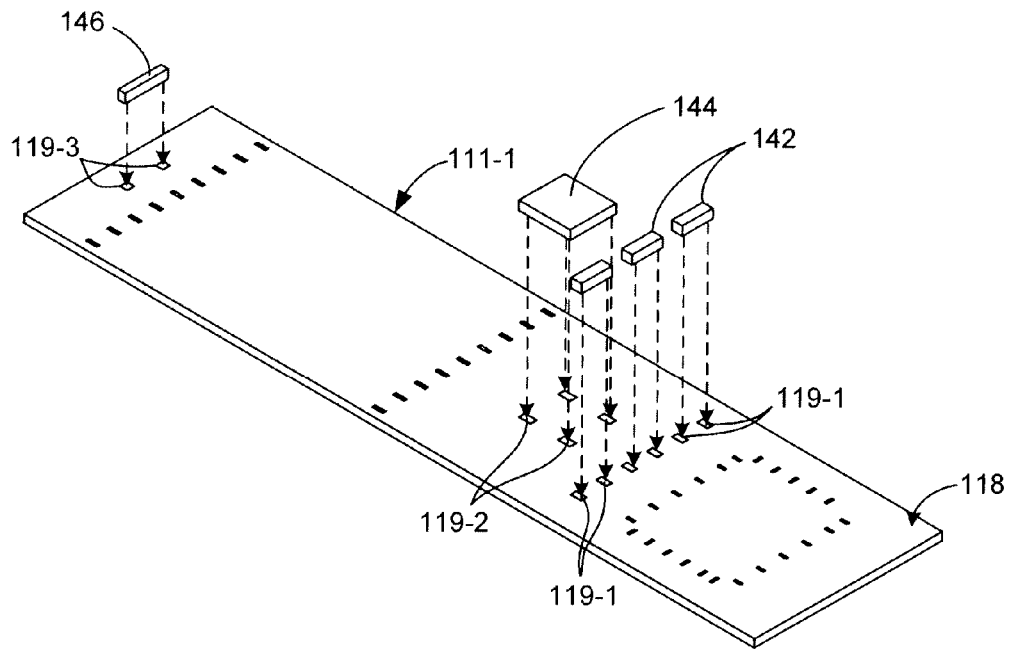
FIG. 5 is a perspective view depicting a surface mount technology (SMT) process for mounting passive components on a PCB according to the method of FIG. 3.
Figure 6:
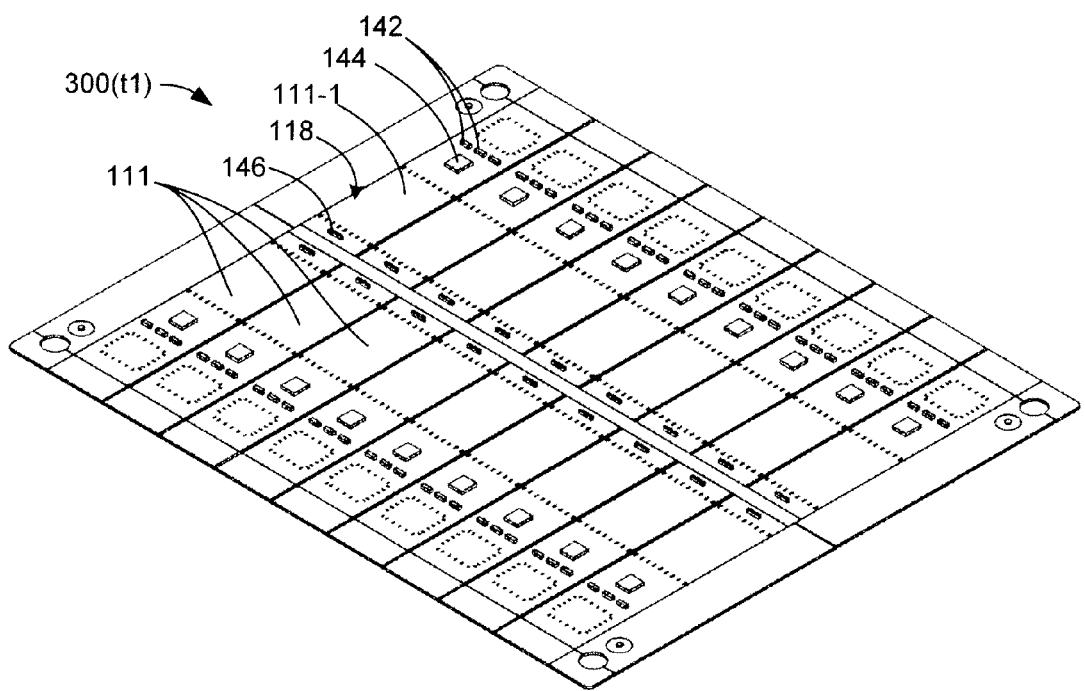
FIG. 6 is a top perspective views showing the PCB panel of FIG. 4(B) after the SMT process is completed.

FIG. 5 is a perspective view depicting a portion of a SMT process that is used to mount passive components on PCB 111-1 according to block 220 of FIG. 3. During the first stage of the SMT process, lead-free solder paste is printed on contact pads 119-1, 119-2 and 119-3, which in the present example correspond to SMT components 142, 144 and 146, using custom made stencil that is tailored to the design and layout of PCB 111-1. After dispensing the solder paste, the panel is conveyed to a conventional pick-and-place machine that mounts SMT components 142, 144 and 146 onto contact pads 119-1, 119-2 and 119-3, respectively, according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300(t1), in which each PCB 111 (e.g., PCB 111-1) includes passive components 142, 144 and 146 mounted thereon by the completed SMT process.

Figure 7:
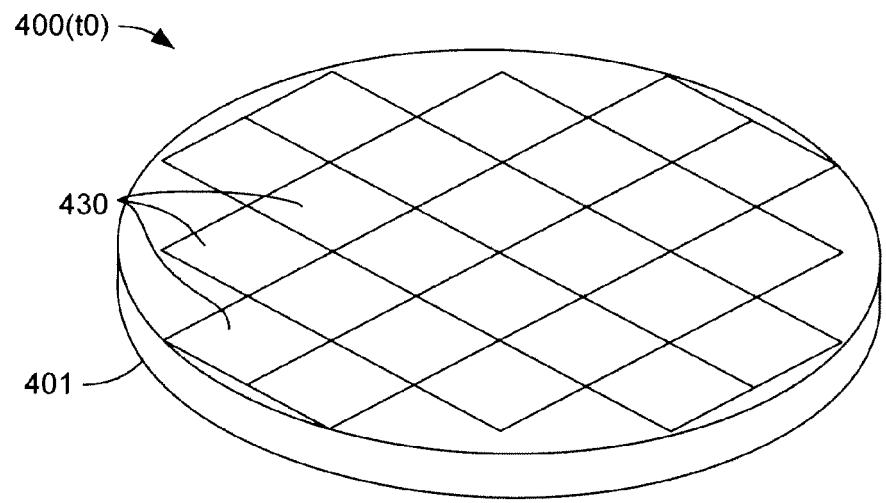
FIG. 7 is a simplified perspective view showing a semiconductor wafer including integrated circuits (ICs) utilized in the method of FIG. 3.

FIG. 7 is a simplified perspective view showing a semiconductor wafer 400(t0) procured or fabricated according to block 214 of FIG. 3. Wafer 400(t0) includes multiple ICs 430 that are formed in accordance with known photolithographic fabrication (e.g., CMOS) techniques on a semiconductor base 401. In the example described below, wafer 400(t1) includes ICs 430 that comprise USB controller circuits. In a related procedure, a wafer (not shown) similar to wafer 400(t1) is produced/procured that includes flash memory circuits, and in an alternative embodiment (described in additional detail below), ICs 430 may include both USB controller circuits and flash memory circuits. In each instance, these wafers are processed as described herein with reference to FIGS. 8(A), 8(B) and 8(C).

Figure 8A:
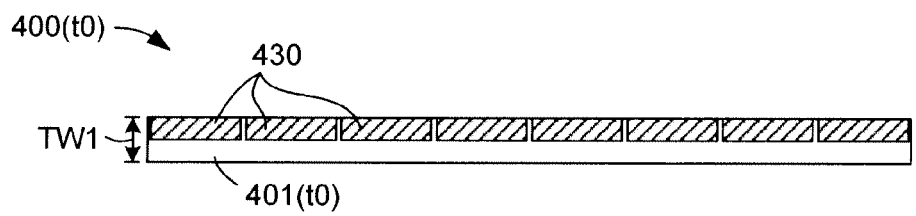
FIGS. 8(A), 8(B) and 8(C) are simplified cross-sectional side views depicting a process of grinding and dicing the wafer of FIG. 7 to produce IC dies.
Figure 8B:
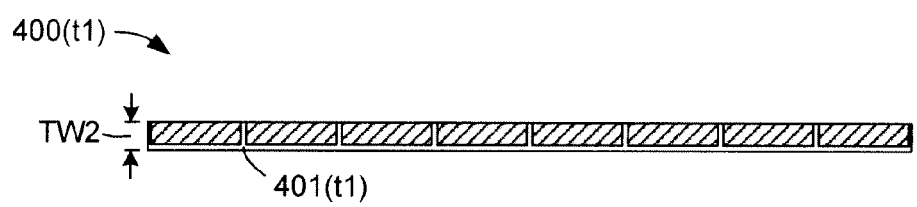

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 8(B), wafer 400(t1) has a pre-programmed thickness TW2 that is less than initial thickness TW1 (shown in FIG. 8(A)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 8C:
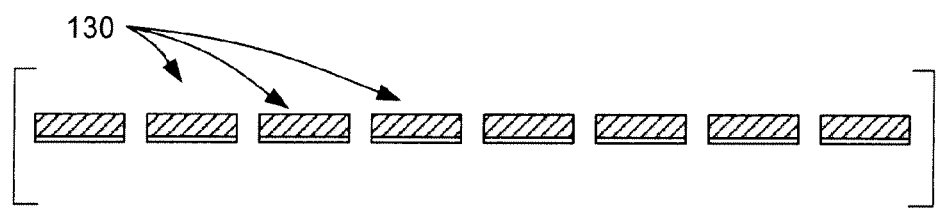

Next, as shown in FIG. 8(C), the wafer is diced (cut apart) along predefined border regions separating ICs 430 in order to produce IC dies 130 according to block 244 of FIG. 3. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 9:
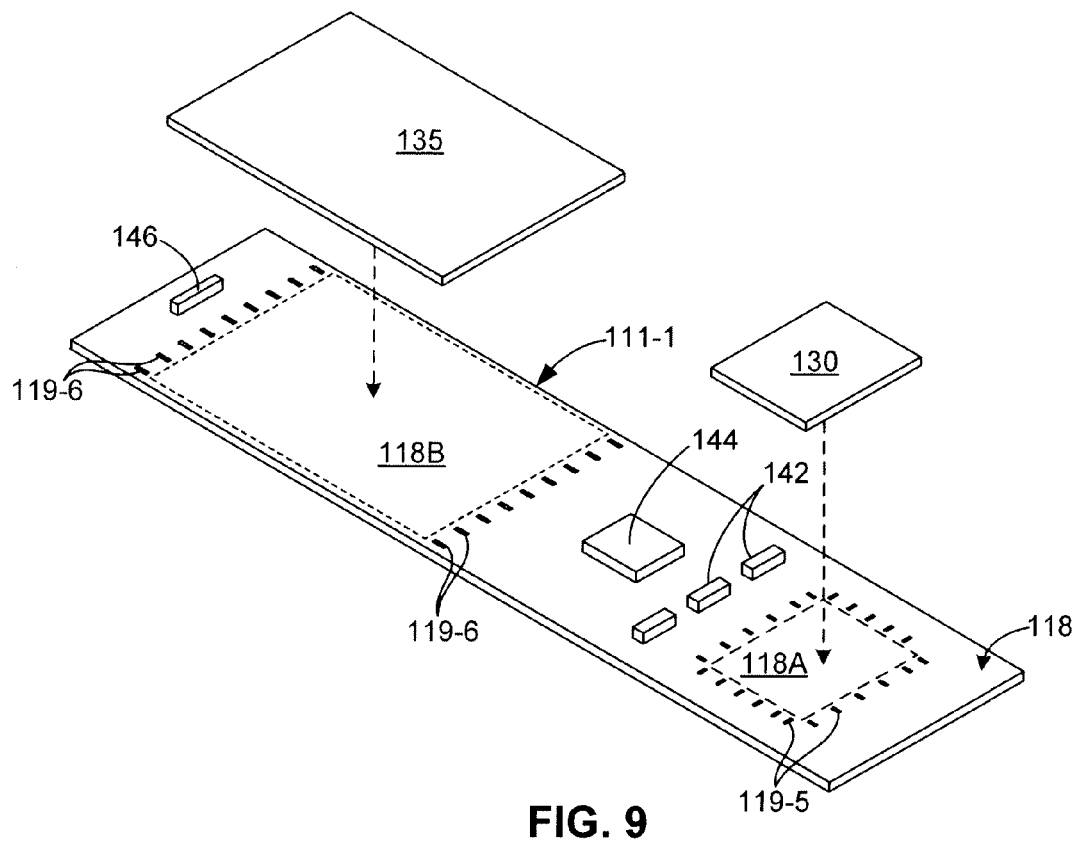
FIG. 9 is a perspective view depicting a die bonding process utilized to mount the IC dies of FIG. 8(C) on a PCB according to the method of FIG. 3.
Figure 10:
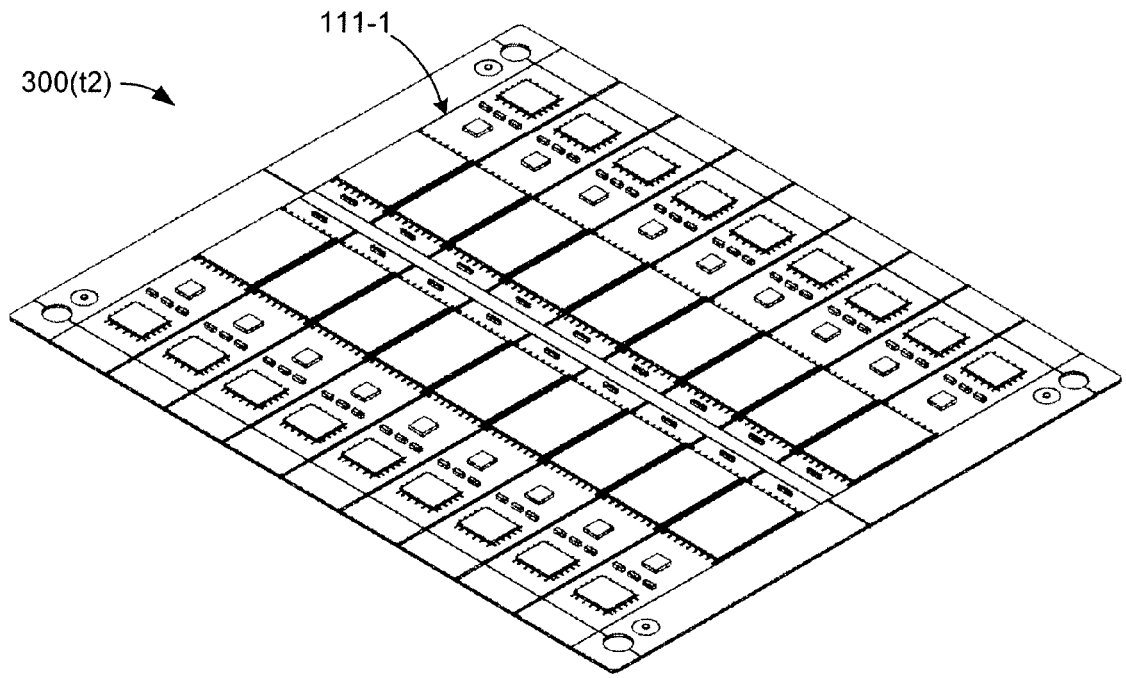
FIG. 10 is a top perspective views showing the PCB panel of FIG. 4(B) after the die bonding process is completed.

FIG. 9 is a perspective view depicting a die bonding process utilized to mount the controller IC dies 130 of FIG. 8(C) and flash memory IC dies 135 on PCB 111-1 of the PCB panel according to block 246 of FIG. 3. The die bonding process is performed on PCB panel 300(t1) (see FIG. 6), that is, after completion of the SMT process. The die bonding process generally involves mounting controller IC dies 130 into lower surface region 118A, which is surrounded by contact pads 119-5, and mounting flash IC dies 135 into lower surface region 118B, which is disposed between rows of contact pads 119-6. In one specific embodiment, an operator loads IC dies 130 and 135 onto a die bonder machine according to known techniques. The operator also loads multiple PCB panels 300(t1) onto the magazine rack of the die bonder machine. The die bonder machine picks the first PCB panel 300(t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300(t1). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top perspective views showing PCB panel 300(t2) after the die bonding process is completed.

Figure 11:
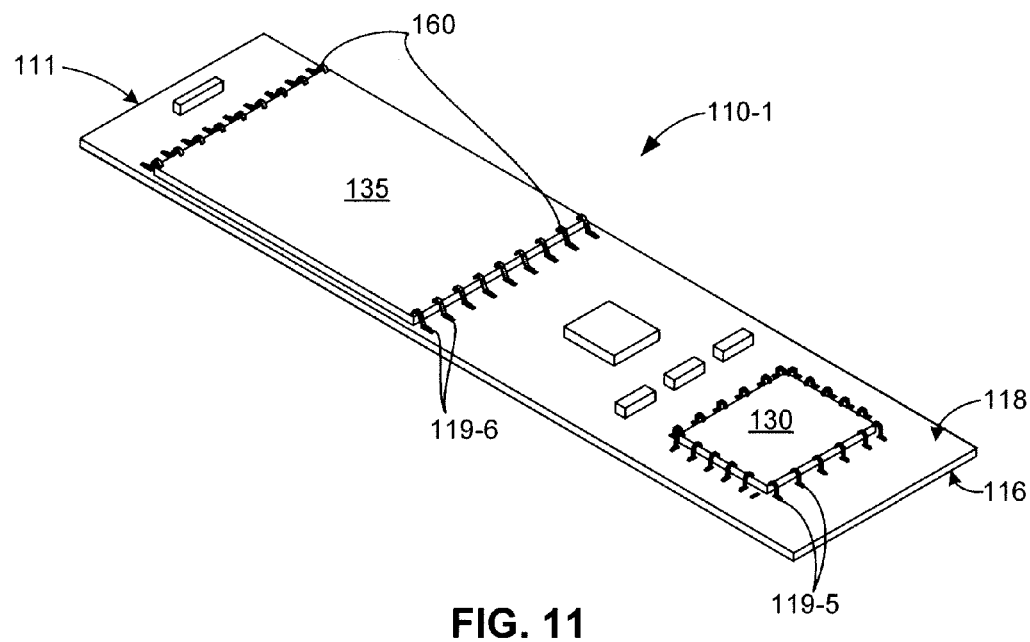
FIG. 11 is a perspective view depicting a wire bonding process utilized to connect the IC dies of FIG. 8(C) to corresponding contact pads disposed on a PCB according to the method of FIG. 3.
Figure 12:
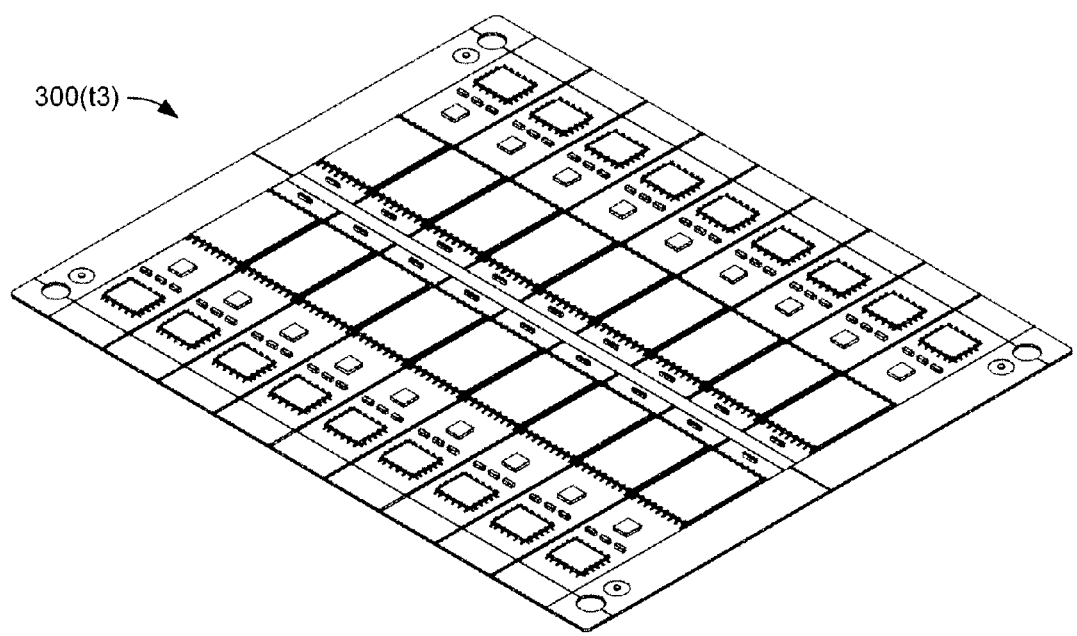
FIG. 12 is a top perspective views showing the PCB panel of FIG. 4(B) after the wire bonding process is completed.

FIG. 11 is a perspective view depicting a wire bonding process utilized to connect the IC dies 130 and 135 to corresponding contact pads 119-5 and 119-6, respectively, according to block 248 of FIG. 3. The wire bonding process proceeds as follows. Once a full magazine of PCB panels 300(t2) (see FIG. 10) has completed the die bonding operation, an operator transports the PCB panels 300(t2) to a nearby wire bonder (WB) machine, and loads the PCB panels 300(t2) onto the magazine input rack of the WB machine. The WB machine is pre-prepared with the correct program to process this specific USB device. The coordinates of all the ICs' pads 119-5 and 119-6 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 12 is a top perspective views showing PCB panel 300(t3) after the wire bonding process is completed.

Figure 13A:
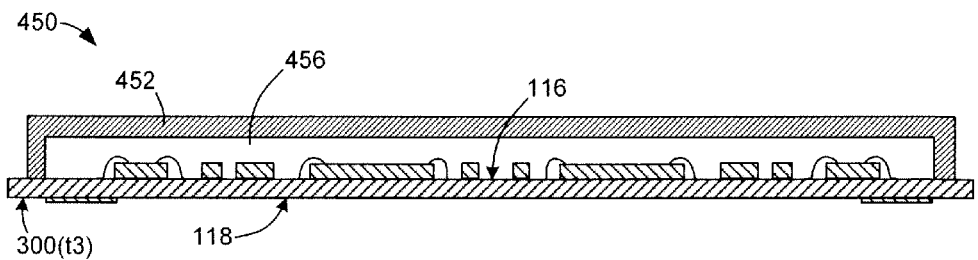
FIGS. 13(A) and 13(B) are simplified cross-sectional side views depicting a molding process for forming a molded housing over the PCB panel of FIG. 4(B) according to the method of FIG. 3.
Figure 13B:
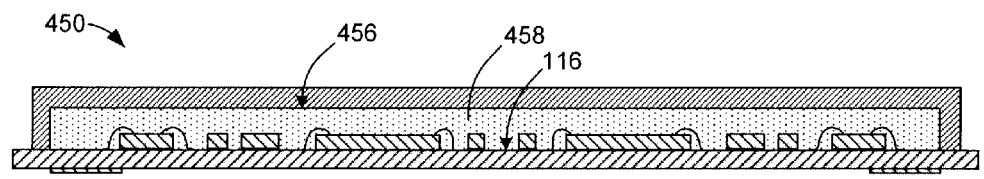
Figure 14:
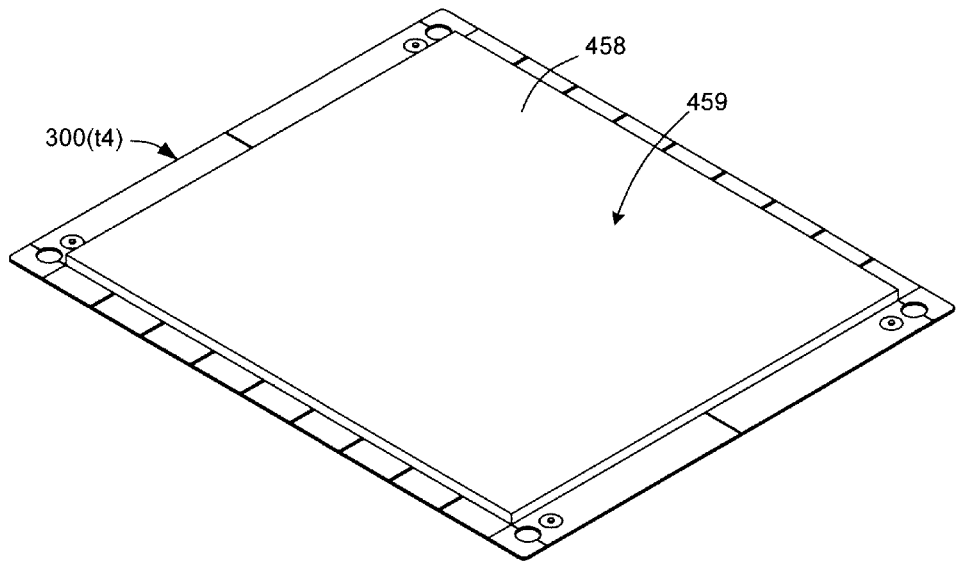
FIG. 14 is a top perspective views showing the PCB panel of FIG. 4(B) after the molding process is completed.

FIGS. 13(A) and 13(B) are simplified cross-sectional side views depicting a molding process for forming a molded housing layer over PCB panel 300(t3) according to block 250 of FIG. 3. As indicated in FIG. 13(A), after the wire bonding process is completed, USB panel 300(t3) is loaded into a mold machine 450 including a cover plate 452 that mounts onto lower surface 116 of PCB panel 300(t3), and defines a chamber 456 that is disposed over the IC chips, wire bonds and passive components that are mounted on lower surface 116. Note that no molding material is applied to upper surface 118. Transfer molding is prefer here due to the high accuracy of transfer molding tooling and low cycle time. The molding material in the form of pellet is preheated and loaded into a pot or chamber (not shown). As depicted in FIG. 13(B), a plunger (not shown) is then used to force the material from the pot through channels known as a spruce and runner system into the mold cavity 456, causing the molten (e.g., plastic) material to form a molding layer 458 that encapsulates all the IC chips and components, and to cover all the exposed areas of lower surface 116. The mold remains closed as the material is inserted and filled up all vacant in cavity 456. During the process, the walls of cover plate 452 are heated to a temperature above the melting point of the mold material, which facilitates a faster flow of material through cavity 456. Mold machine 450 remains closed until a curing reaction within the molding material is complete. A cooling down cycle follows the injection process, and the molding materials of molding layer 458 start to solidify and harden. Ejector pins push PCB panel 300(t4) (shown in FIG. 14) from the mold machine once molding layer 458 has hardened sufficiently. As depicted in FIG. 14, molding layer 458 forms a uniform block with a flat, smooth upper surface 459 on PCB panel 300(t4).

FIG. 15 is simplified cross-sectional side view depicting a singulation process according to block 260 of FIG. 3 that is used to separate PCB panel 300(t4) into individual USB devices. PCB panel 300(t4) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) the USB pane 300(t4), for example, successively along cut lines 311-1, 341-1, 341-2, and 311-2, and then along the side cut lines and PCB cut lines (see FIG. 4(A)) to form individual USB devices according to the pre-programmed singulation routine. FIGS. 16(A) and 16(B) are top and bottom perspective views showing a modular USB core component 100 after the singulation process is completed.

FIGS. 17(A) and 17(B) are top and bottom perspective views showing a singulated modular USB core component 100 after a marking process is performed in accordance with block 270 of the method of FIG. 3. The singulated and completed USB devices 100 undergo a marking process in which a designated company's logo, USB logo, RoHs logo, speed value, density value, or other related information are printed on surface 152 of housing 150 and/or upper surface 116 of PCB 111. After marking, USB devices 100 are placed in the baking oven to cure the permanent ink.

Referring to block 280 located at the bottom of FIG. 3, a final procedure in the manufacturing method of the present invention involves testing, packing and shipping the individual USB devices. The marked USB devices 100 shown in FIGS. 17(A) and 17(B) are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents.

As suggested in the above example, in addition to reducing overall manufacturing costs by utilizing unpackaged controller and flash memory dies (i.e., by eliminating the packaging costs associated with SMT-ready controller and flash memory devices), the present invention provides a further benefit of facilitating greatly expanded memory capacity without increasing the overall size of modular USB core component 100. For example, FIG. 18 is simplified cross-sectional side view showing a stacked-memory USB device 500 in which a first flash memory chip 535-1 is mounted on a lower surface 518 and connected by first wire bonds 560-1 to PCB 511 in the manner described above. Because the IC die height (thickness) D is much smaller than packaged flash memory devices, and because the thickness T1 of USB device 500 is set, for example, at 2.0 mm to assure a snug fit of plug structure 105 inside lower region of a standard female USB socket connector, the present invention facilitates a stacked memory arrangement in which a second flash memory die 535-2 is mounted on first flash memory die 535-1 and connected to PCB 511 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the USB devices without increasing the footprint (i.e., thickness T1, length and width) of modular USB core component 500.

Figure 20:
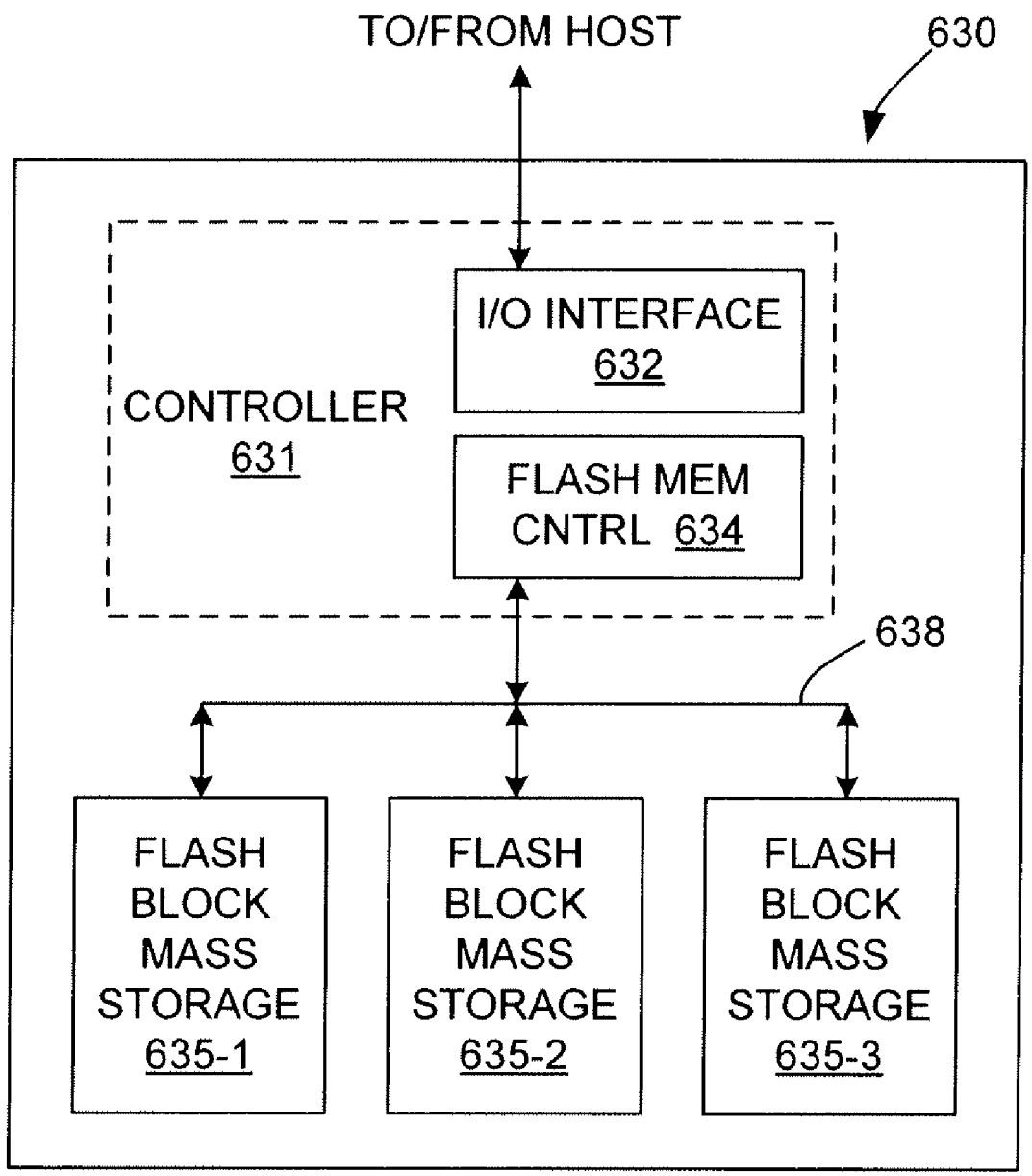
FIG. 20 is a block diagram showing a flash microcontroller integrated circuit die with flash mass storage blocks.

FIG. 19 is simplified cross-sectional side view showing a modular USB core component 600 including stacked-memory according to another embodiment of the present invention. Modular USB core component 600 is distinguished over the previous embodiments in that, instead of separate USB controller and flash memory chips, USB device 600 utilizes a single-chip controller/flash die 630 that is connected to a PCB 610 by way of wire bonds 660 in the manner described above, and is characterized in that, as shown in FIG. 20, single-chip controller/flash die 630 includes both a controller circuit 631 and one or more flash block mass storage circuits 635-1 to 635-3 that are interconnected by a bus 638. Controller circuit 631 includes an input/output (I/O) interface circuit 632 that facilitates sending and receiving commands and data to/from a host (not shown) into which USB device 600 is plugged. Controller circuit 631 also includes a flash-memory controller 634 that facilitates sending and receiving sends data over one or more internal flash buses 638 to/from flash mass storage blocks 635-1, 635-2, 635-3. Because internal flash bus 638 is internal to single-chip controller/flash die 630, external pins are not required for the interface to flash memory blocks 635-1, 635-2, 635-3. In one embodiment, flash mass storage blocks 635-1, 635-2, 635-3 are not randomly accessible. Instead, a command and an address are transferred as data over internal flash bus 638 to indicate a block of data to transfer from flash mass storage blocks 635-1, 635-2, 635-3. Thus, flash mass storage blocks 635-1, 635-2, 635-3 are block-addressable mass storage, rather than random-access memory (RAM). In another embodiment, flash mass storage blocks 635-1, 635-2, 635-3 are aggregated together by flash-memory controller 634 of controller circuit 631, which maps and directs data transactions to selected flash storage blocks 635-1, 635-2, 635-3. Because the flash-memory controller 634 performs memory management, flash storage blocks 635-1, 635-2, 635-3 appear as a single, contiguous memory to external hosts. Additional details regarding the use of single-chip controller/flash die 630 is provided in co-owned U.S. Pat. No. 7,103,684, which is incorporated herein by reference in its entirety.

In accordance with another aspect of the present invention, the modular USB core components described in the embodiments above are retractably or slidably incorporated into package casings (cases) in order to form completed USB assemblies (i.e., USB devices suitable for sale to an end user) in which the retractable casing protects the metal contacts from contamination or damage (e.g., scratches) when the USB assembly is not in use, and facilitates deploying the plug end of the modular core USB component using a thumb or finger when use is desired. Several examples of such retractable USB assemblies are described in the following paragraphs. In addition, different package assembly methods are described in which the modular USB core component is retractably or slidably mounted or otherwise disposed inside a case to produce a final memory card product. For brevity, a generalized modular USB core component 100 is used in the following examples and represents any of the embodiments described above.

Figure 21:
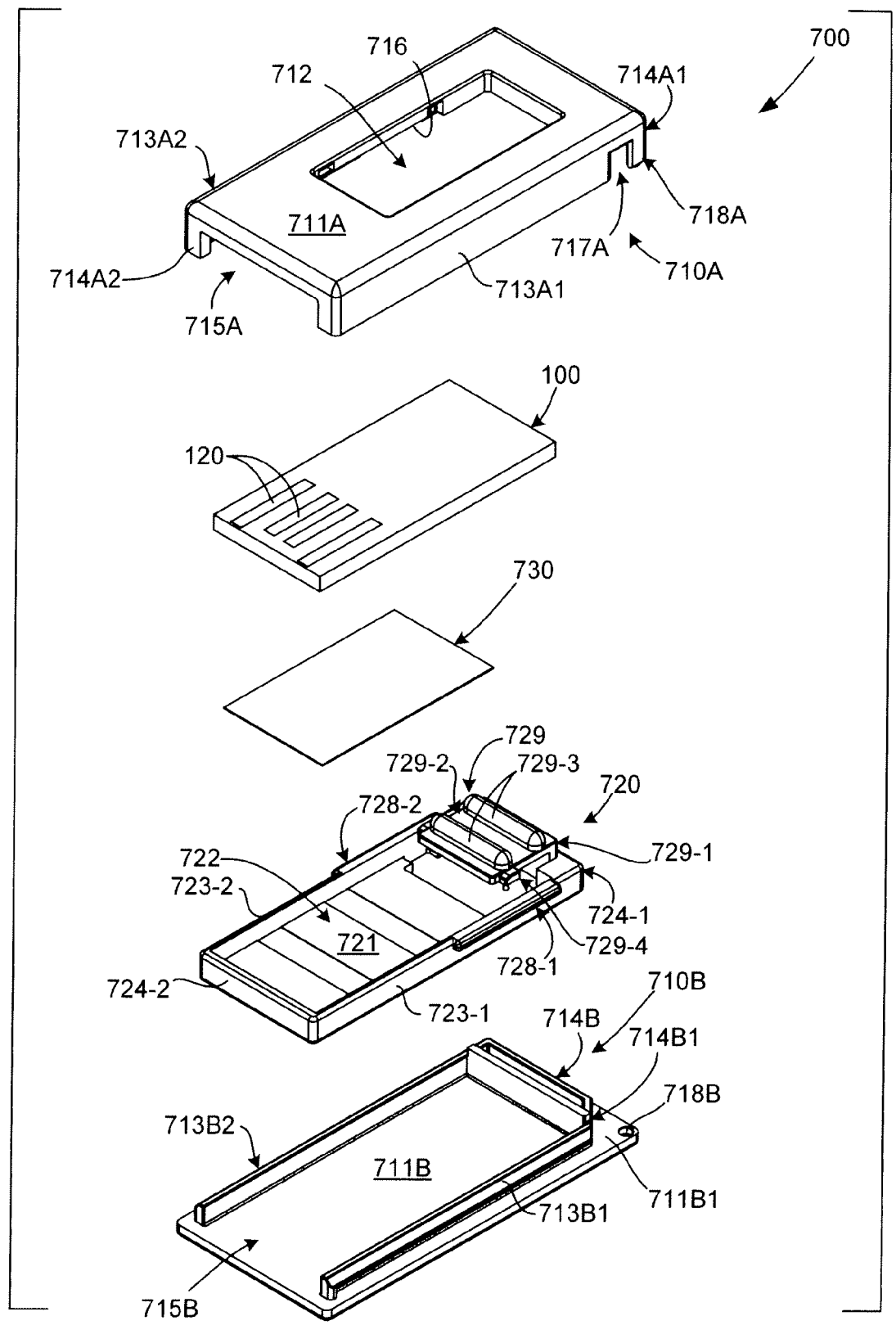
FIG. 21 is an exploded perspective view showing a USB assembly with a modular USB core component disposed in a housing a retractable mechanism according to another embodiment of the present invention.

FIG. 21 is an exploded perspective view showing a retractable USB assembly 700 according to a first specific embodiment that includes an upper housing portion 710A, a lower housing portion 710B, a movable holder (retractable mechanism) 720 for supporting modular USB core component 100, and an adhesive layer (e.g., a double sided self-adhesive tape) 730.

Upper housing portion 710A includes an upper wall 711A defining an upper opening 712, opposing side walls 713A1 and 713A2, a rear wall 714A1, and a front wall 714A2 that defines a front opening 715A. A locking groove 716 is defined on a flange extending downward from upper wall 711A along the peripheral edge of upper opening 712. Located adjacent to rear wall 714A1 is rear opening 717A and a corner post structure 718A. Upper housing portion 710A is a pre-molded plastic structure formed using known techniques. The term "pre-molded" is used herein to indicate that housing portion 710A is an integral molded structure formed during a separate (e.g., injection) plastic molding process that is performed prior to assembly. In one embodiment, the plastic material used to form housing portion 710A is one of a colorless transparent type, colored translucent type, or colored opaque type including ivory.

Lower housing portion 710B includes a lower wall 711B, opposing side walls 713B1 and 713B2, and a rear wall 714B (the front end of side walls 713B1 and 713B2 define a front slot 715B). Rear wall 714B includes a bevel section 714B1 that exposes a corner portion 711B1 of lower wall 711B, which defines a rear corner locking hole 718B. In one embodiment, lower housing portion 710B is made of Zn (zinc) or Al (aluminum) die-casting finished with bright and shinny chromium plating.

Holder 720 provides a retractable mechanism in cooperation with upper housing portion 710A and lower housing portion 710B to facilitate manual deployment and retraction of modular USB core component 100. As indicated in FIG. 21, holder 720 has a lower wall 721 that is surrounded by peripheral walls (i.e., opposing side walls 723-1 and 723-2, a rear wall 724-1 and a front wall 724-2), thereby forming a trough 722 for receiving modular USB core component 100. Holder 720 also includes protruding sills 728-1 and 728-2 that are designed to mate with corresponding slots (not shown) defined in upper housing portion 710A to serve as a guide for in-and-out sliding movement. A resilient structure 729 includes a base portion 729-1 integrally molded onto rear wall 724-1, a horizontal platform 729-2 spaced from and extending parallel to lower wall 721, a pair of rib-like protruding buttons 729-3 extending upward from horizontal platform 729-2, and a pair of locking protrusions 729-4 disposed on opposite sides of horizontal platform 729-2. Resilient structure 729 is formed such that, when protruding buttons 729-3 are pressed toward lower wall 721, base portion 729-1 and horizontal portion 729-2 resiliently bias protruding buttons 729-3 are resiliently biased away from lower wall 721. In one embodiment holder 720 is a single-piece pre-molded plastic structure formed using a suitable (preferably shiny black) resilient plastic.

Figure 22A:
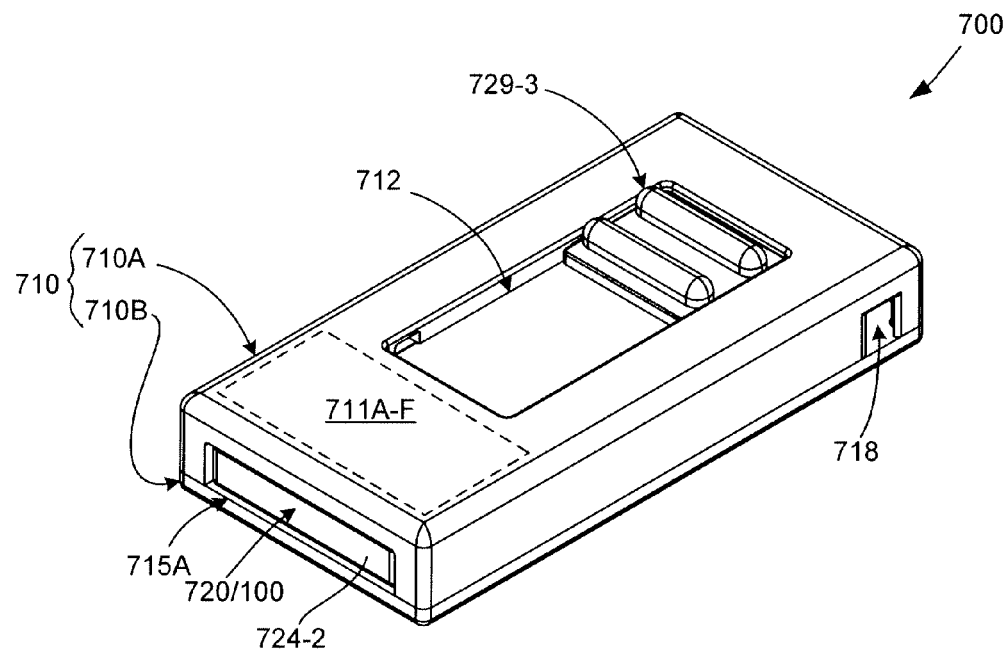
FIGS. 22(A) and 22(B) are front perspective (retracted) and front perspective (deployed) views showing the USB assembly of FIG. 21 in an assembled state.
Figure 22B:
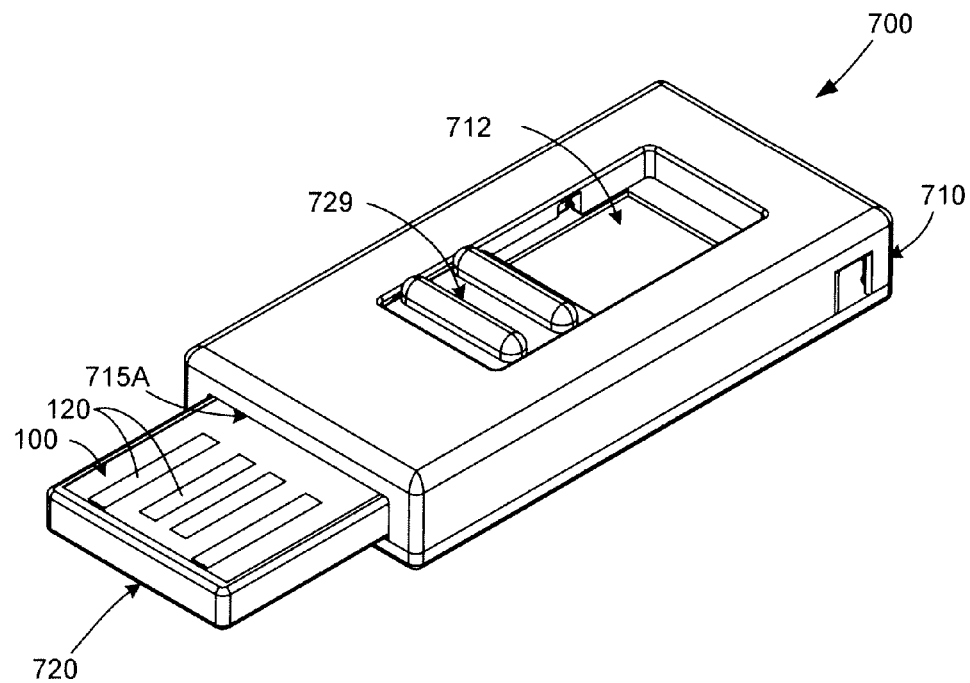

During assembly, the various wall structures of upper housing portion 710A and lower housing portion 710B are mated such that, when connected together as shown in FIGS. 22(A) and 22(B)), they collectively form a housing 710 that is disposed around modular USB core component 100 such that metal contacts 120 are disposed adjacent to front opening 715A. The assembly process begins by taping modular USB core component 100 into trough 722 using double sided adhesive tape 730. Holder 720 is then placed in the three sided cavity formed by side walls 713B1 and 713B2 and rear wall 714B of lower housing portion 710B. Upper housing portion 710A is then positioned over lower housing portion 710B and secured by way of snap-coupling (in alternative embodiments, other connection mechanisms such as adhesive or ultrasonic welding may be used). Note that holder 720 and modular USB core component 100 are slidably disposed in a cavity defined by upper housing portion 710A and lower housing portion 710B (i.e., referring to FIG. 21, between upper wall 711A, lower wall 711B, side walls 713A1/B1 and 713A2/B2, and rear walls 714A1 and 714B1).

The completed USB assembly 700 is shown in FIGS. 22(A) and 22(B). In a retracted position (e.g., as shown in FIG. 22(A)), metal contacts 120 are disposed inside housing 710 (e.g., under a front upper wall region 711A-F). Note that holder 720 is disposed inside housing 710 such that front wall 724-2 disposed adjacent to front opening 715A in the retracted position shown in FIG. 22(A). Conversely, in the deployed position (e.g., as shown in FIG. 22(B)), a front portion of holder 720 and modular USB core component 100 extend through front opening 715A such that metal contacts 120 are exposed outside housing 710 for access by a data terminal (not shown). The deploying and retracting operations are manually performed by pressing and pushing protruding button 729-3 between the rearmost end of upper opening 712, as shown in FIG. 22(A) and the foremost end of upper opening 712, as shown in FIG. 22(B). Referring to FIG. 21, rear corner structure 718A includes a post that mounts into rear corner locking hole 718B, whereby, as shown in FIG. 22(A), a key chain hole 718 is provided to receive a string or chain to form a key holder, or simply for users to hang tiny ornaments for decoration.

Figure 23A:
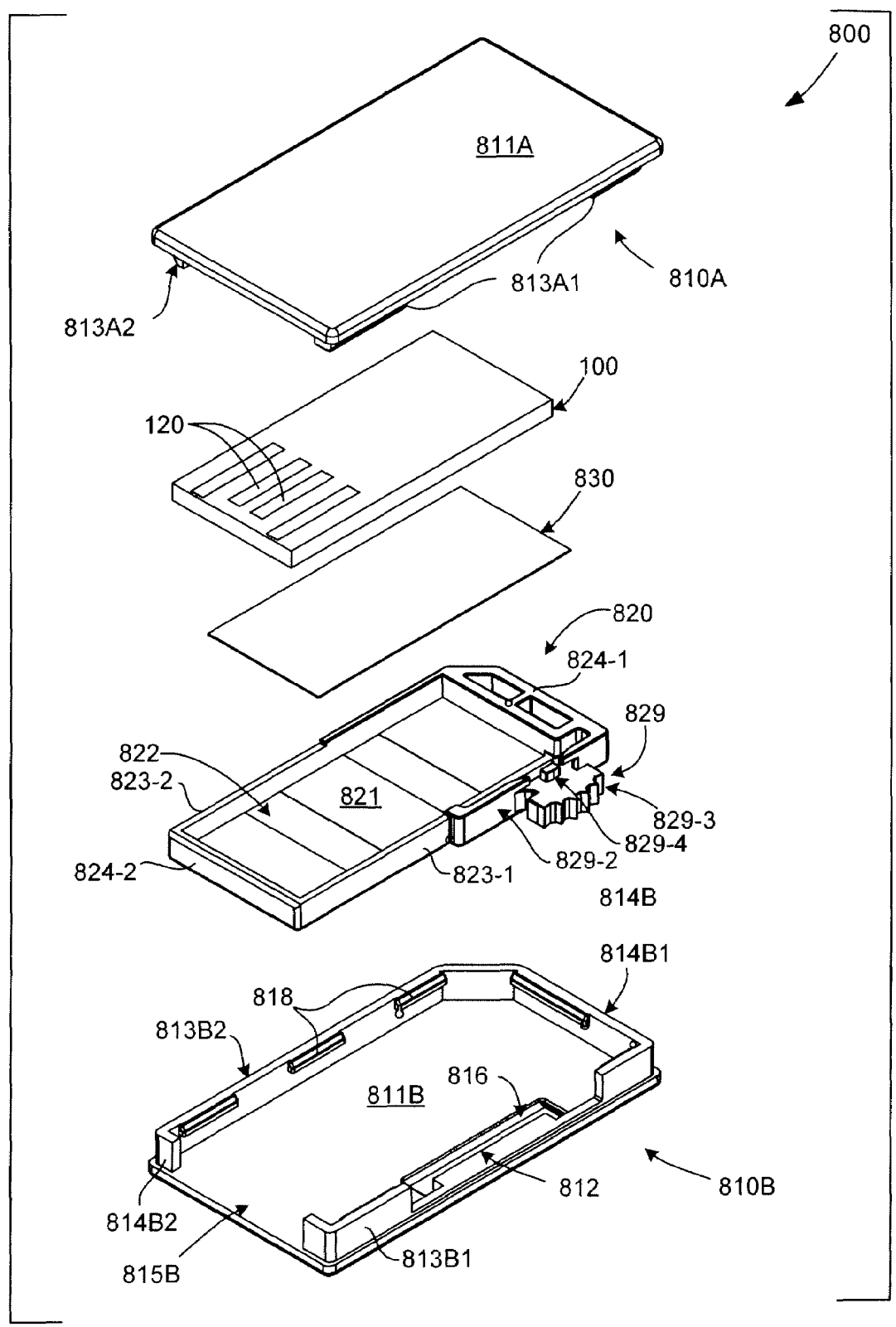
FIGS. 23(A), 23(B) and 23(C) are exploded perspective, front perspective (retracted) and front perspective (deployed) views showing a USB assembly with a modular USB core component disposed in a housing a retractable mechanism according to another embodiment of the present invention.
Figure 23B:
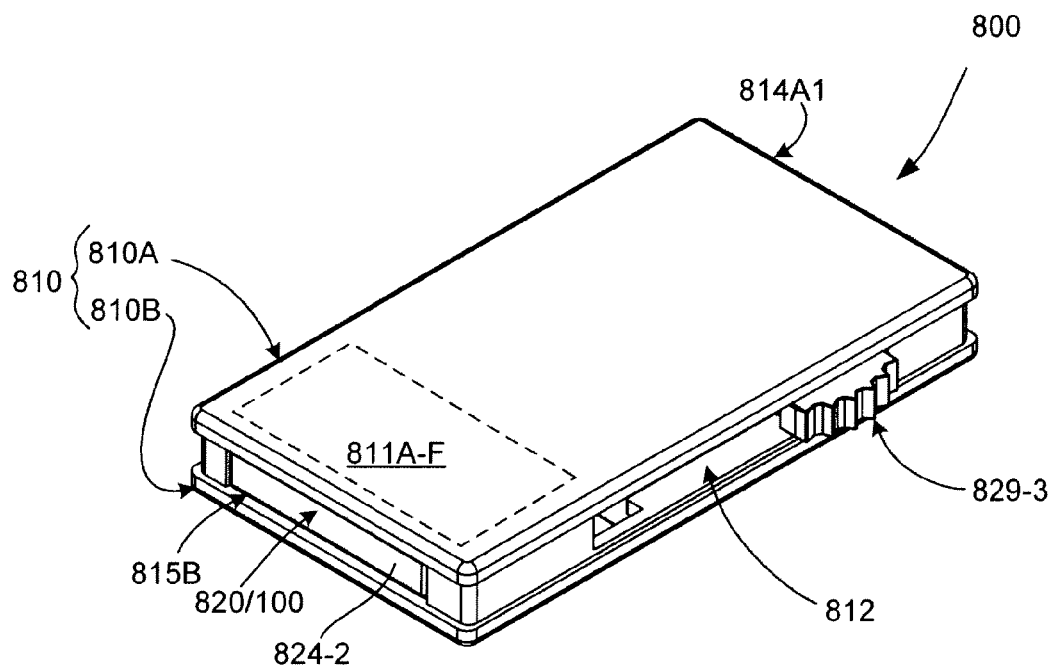
Figure 23C:
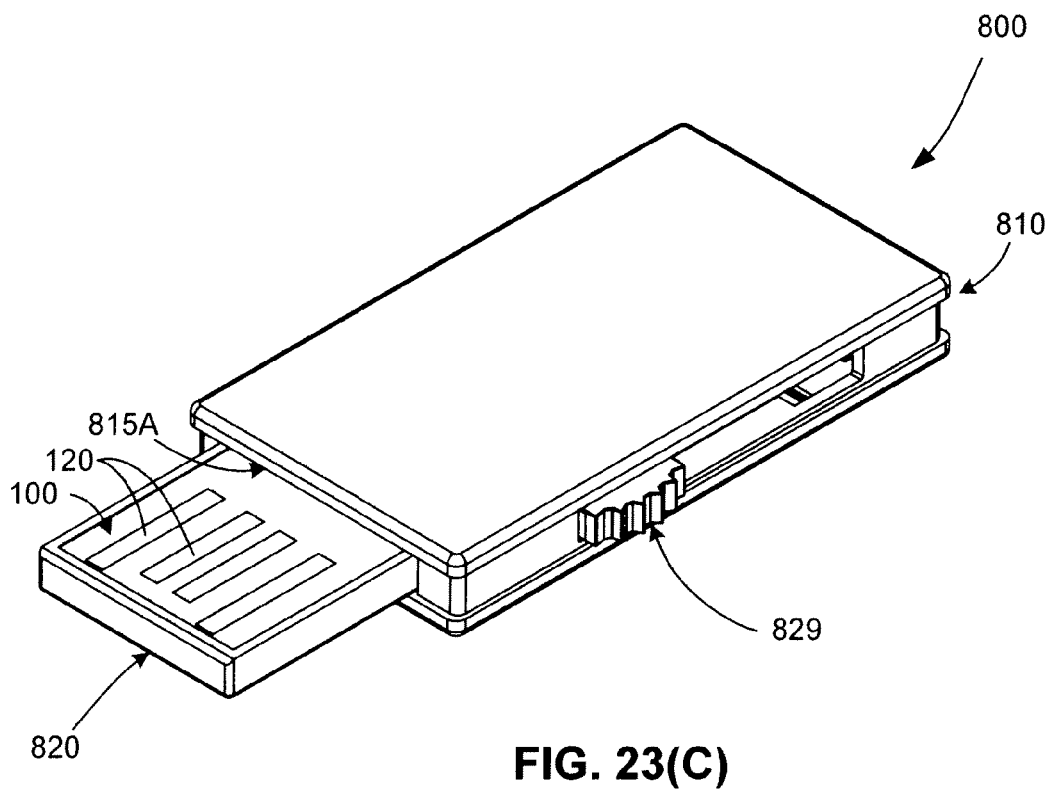

FIGS. 23(A), 23(B) and 23(C) show a USB assembly 800 according to another embodiment of the present invention. USB assembly 800 includes an upper housing portion 810A, a lower housing portion 810B, a movable holder (retractable mechanism) 820 for supporting modular USB core component 100, and an adhesive layer 830.

Upper housing portion 810A includes an upper wall 811A, opposing side wall portions 813A1 and 813A2, and a rear wall (not shown) similar to that of lower housing portion 710B (see FIG. 21) that includes a bevel section. Side wall portions 813A1 and 813A2 include notches (not shown) that facilitate snap-coupling to lower housing portion 810B. Side wall portion 813A1 is separated into two sections to facilitate manipulation of holder 820 in the manner described below. In one embodiment, upper housing portion 810A is made of Zn (zinc) or Al (aluminum) die-casting finished with bright and shinny chromium plating.

Lower housing portion 810B includes a lower wall 811B, opposing side walls 813B1 and 813B2, a rear wall 814B1, and a front wall 814B2. Side wall 813B1 defines a side opening 812, and a locking groove 816 is defined on a flange extending inward from side wall 813B1 adjacent to side opening 812. Lower housing portion 810B is a pre-molded plastic structure formed using known techniques.

Holder 820 provides a retractable mechanism in cooperation with upper housing portion 810A and lower housing portion 810B to facilitate manual deployment and retraction of modular USB core component 100. As indicated in FIG. 22(A), holder 820 has a lower wall 821 that is surrounded by peripheral walls (i.e., opposing side walls 823-1 and 823-2, a rear wall 824-1 and a front wall 824-2), thereby forming a trough 822 for receiving modular USB core component 100. A resilient structure 829 includes a horizontal platform 829-2, a protruding button 829-3 having several fine ribs to provide better friction for thumb or finger manual (push-and-slide) actuation extending outward from horizontal platform 829-2, and locking protrusions 829-4 disposed on opposite sides of horizontal platform 829-2. Resilient structure 829 is formed such that, when protruding buttons 829-3 are pressed toward lower wall 821, horizontal portion 829-2 resiliently biases protruding button 829-3 are resiliently biased away from lower wall 821. In one embodiment holder 820 is made of Zn (zinc) or Al (aluminum) die-casting finished with bright and shinny chromium plating that match the die-casting cover chromium plating of upper housing portion 810A.

During assembly, the various wall structures of upper housing portion 810A and lower housing portion 810B are mated such that, when connected together as shown in FIGS. 23(B) and 23(C)), they collectively form a housing 810 that is disposed around modular USB core component 100 such that metal contacts 120 are disposed adjacent to front opening 815B. The assembly process begins by taping modular USB core component 100 into trough 822 using double sided adhesive tape 830. Holder 820 is then placed in the three sided cavity formed by side walls 813B1 and 813B2 and rear wall 814B of lower housing portion 810B, such that resilient structure 829 extends through side opening 812. Upper housing portion 810A is then positioned over lower housing portion 810B and secured by way of snap-coupling ridge-like protrusions 818 extending from side walls 813B1 and 813B2 and rear wall 814B1 into corresponding grooves (not shown) formed on upper housing portion 810A. Holder 820 and modular USB core component 100 are thus slidably disposed in a cavity defined by upper housing portion 810A and lower housing portion 810B.

The completed USB assembly 800 is shown in FIGS. 23(B) and 23(C). In a retracted position (e.g., as shown in FIG. 23(B)), metal contacts 120 are disposed inside housing 810 (e.g., under a front upper wall region 811A-F). Note that holder 820 is disposed inside housing 810 such that front wall 824-2 disposed adjacent to front opening 815B in the retracted position shown in FIG. 23(B). Conversely, in the deployed position (e.g., as shown in FIG. 23(C)), a front portion of holder 820 and modular USB core component 100 extend through front opening 815A such that metal contacts 120 are exposed outside housing 810 for access by a data terminal (not shown). The deploying and retracting operations are manually performed by pressing and pushing protruding button 829-3 between the rearmost end of side opening 829, as shown in FIG. 23(B) and the foremost end of side opening 812, as shown in FIG. 23(C).

Figure 24A:
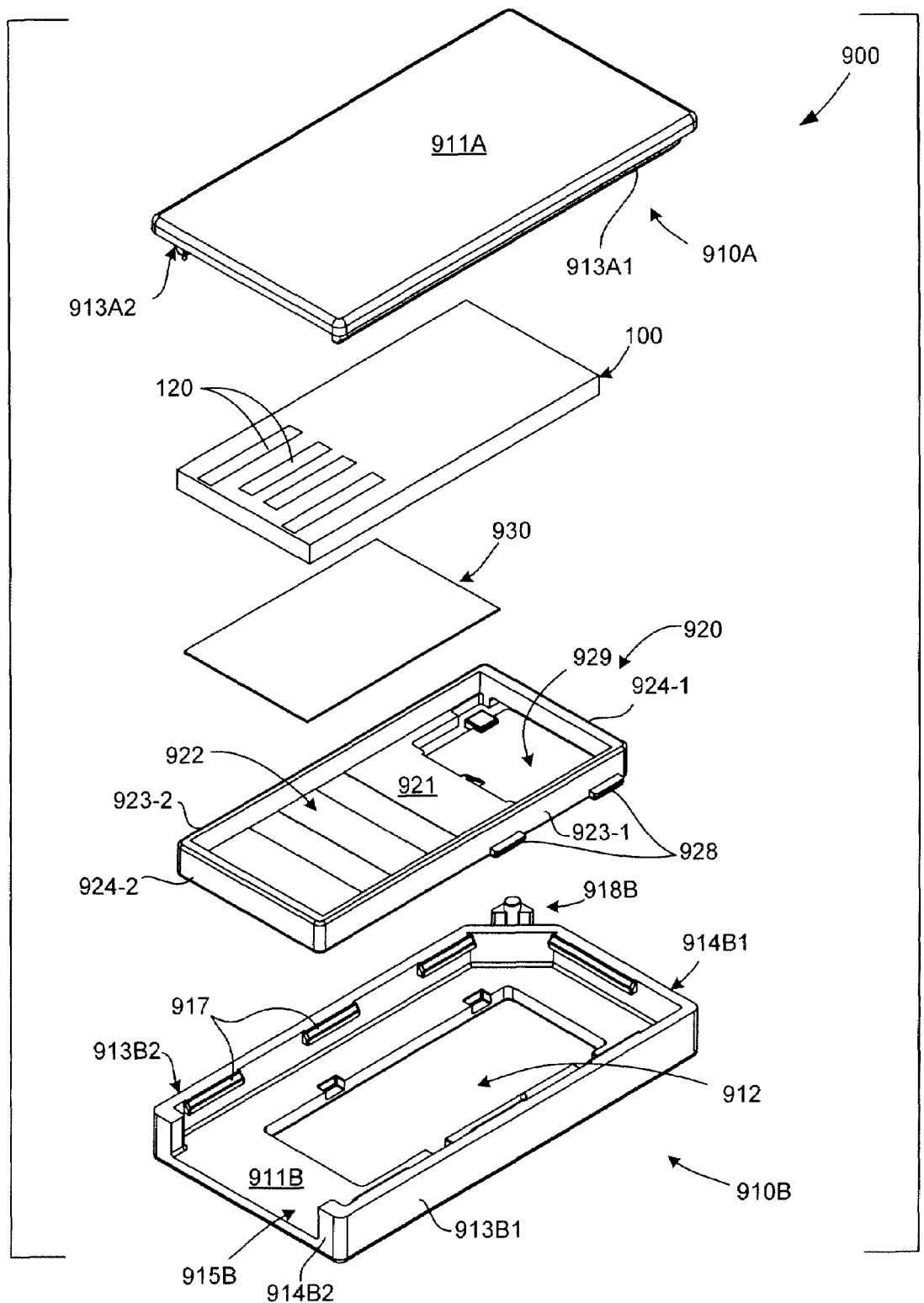
FIGS. 24(A), 24(B) and 24(C) are exploded perspective, bottom front perspective (retracted) and top front perspective (deployed) views showing a USB assembly with a modular USB core component disposed in a housing a retractable mechanism according to another embodiment of the present invention.
Figure 24B:
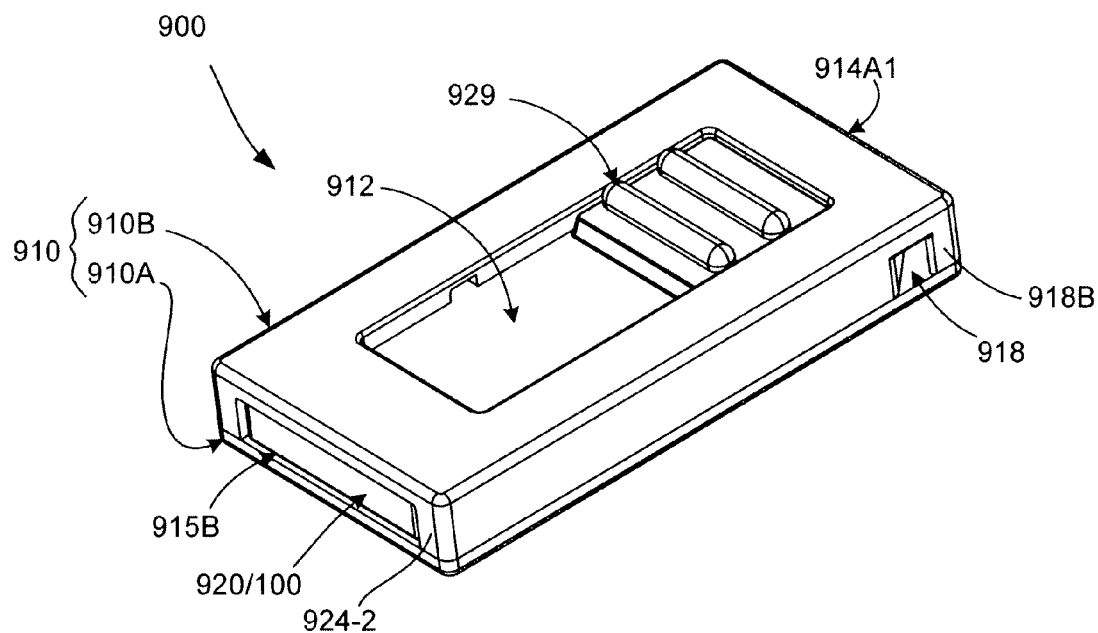
Figure 24C:
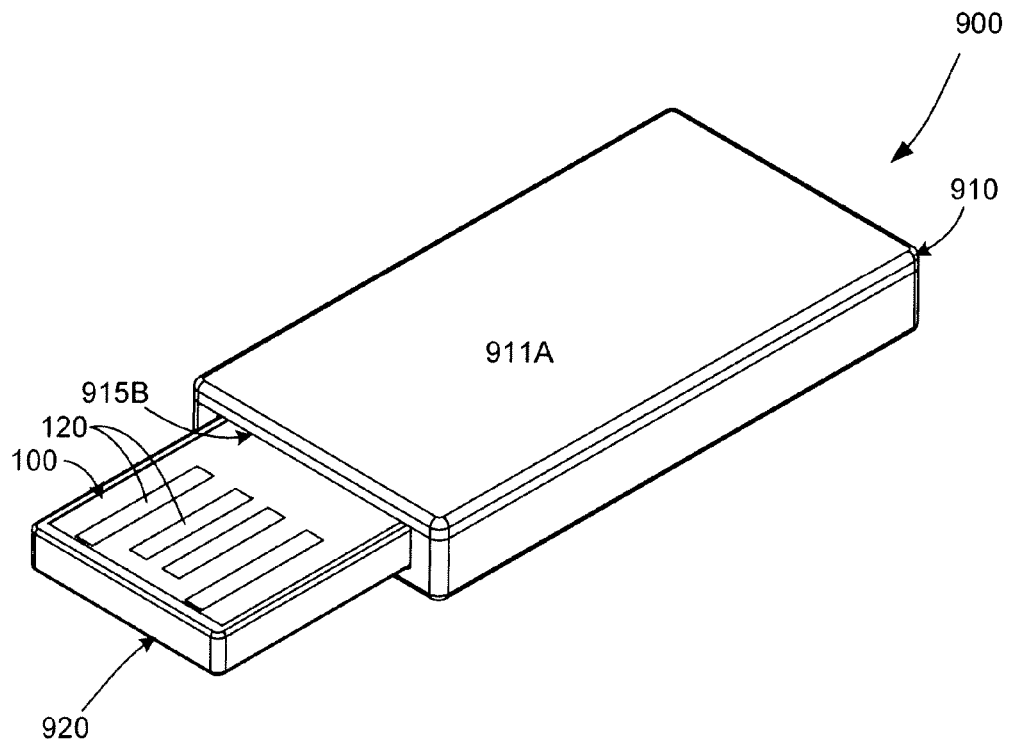

FIGS. 24(A), 24(B) and 24(C) show a USB assembly 900 according to another embodiment of the present invention. USB assembly 900 includes an upper housing portion 910A, a lower housing portion 910B, a movable holder (retractable mechanism) 920 for supporting modular USB core component 100, and an adhesive layer 930.

Upper housing portion 910A includes an upper wall 911A, opposing side wall portions 913A1 and 913A2, and a rear wall (not shown) similar to that of lower housing portion 710B (see FIG. 21) that includes a bevel section and a hole for receiving corner structure 918B. In one embodiment, upper housing portion 910A is made of Zn (zinc) or Al (aluminum) die-casting finished with bright and shinny chromium plating.

Lower housing portion 910B is a pre-molded plastic structure including a lower wall 911B, opposing side walls 913B1 and 913B2, a rear wall 914B1, and a front wall 914B2. Lower wall 911B defines a lower opening 912, and ridge-like locking protrusions 917 extend from the side and rear walls in the manner described above. A rear corner structure 918A similar to that used in the embodiment of FIG. 21 is provided adjacent to a beveled portion of rear wall 914B1. In one embodiment, the plastic material used to form housing portion 910B is one of a colorless transparent type, colored translucent type, or colored opaque type including ivory.

Holder 920 provides a retractable mechanism in cooperation with upper housing portion 910A and lower housing portion 910B to facilitate manual deployment and retraction of modular USB core component 100. As indicated in FIG. 24(A), holder 920 has a lower wall 921 that is surrounded by peripheral walls (i.e., opposing side walls 923-1 and 923-2, a rear wall 924-1 and a front wall 924-2), thereby forming a trough 922 for receiving modular USB core component 100. Holder 920 also includes protruding sills 928 that are designed to mate with corresponding slots (not shown) defined in upper housing portion 910A to serve as a guide for in-and-out sliding movement. A resilient structure 929 similar to resilient structure 729 (see FIG. 23(A)) extends below lower wall 921. Resilient structure 929 is formed in the manner described above such that protruding buttons are resiliently biased outward from the assembly. In one embodiment holder 920 is a single-piece pre-molded plastic structure formed using a suitable (preferably shiny black) resilient plastic.

During assembly, modular USB core component 100 is taped into trough 922 using double sided adhesive tape 930. Holder 920 is then placed in the three sided cavity formed by side walls 913B1 and 913B2 and rear wall 914B of lower housing portion 910B, such that resilient structure 929 extends through lower opening 912. Upper housing portion 910A is then positioned over lower housing portion 910B and secured by way of snap-coupling ridge-like protrusions 917 extending from side walls 913B1 and 913B2 and rear wall 914B1 into corresponding grooves (not shown) formed on upper housing portion 910A. Holder 920 and modular USB core component 100 are thus slidably disposed in a cavity defined by upper housing portion 910A and lower housing portion 910B.

The completed USB assembly 900 is shown in FIGS. 24(B) and 24(C), where FIG. 24(B) is a bottom perspective view and FIG. 24(C) is a top perspective view. In a retracted position (e.g., as shown in FIG. 24(B)), metal contacts 120 and holder 920 are disposed inside housing 910 such that front wall 924-2 disposed adjacent to front opening 915B in the manner described above. Conversely, in the deployed position (e.g., as shown in FIG. 24(C)), a front portion of holder 920 and modular USB core component 100 extend through front opening 915B such that metal contacts 120 are exposed outside housing 910 for access by a data terminal (not shown). The deploying and retracting operations are manually performed by pressing and pushing protruding button 929-3 between the rearmost end of side opening 912, as shown in FIG. 24(B) and the foremost end of side opening 912. Referring to FIG. 24(B), rear corner structure 918B mounts into a rear corner locking hole provided on upper housing portion 910A, thereby forming a through opening 918 to receive a string or chain to form a key holder, or simply for users to hang tiny ornaments for decoration.

Figure 25A:
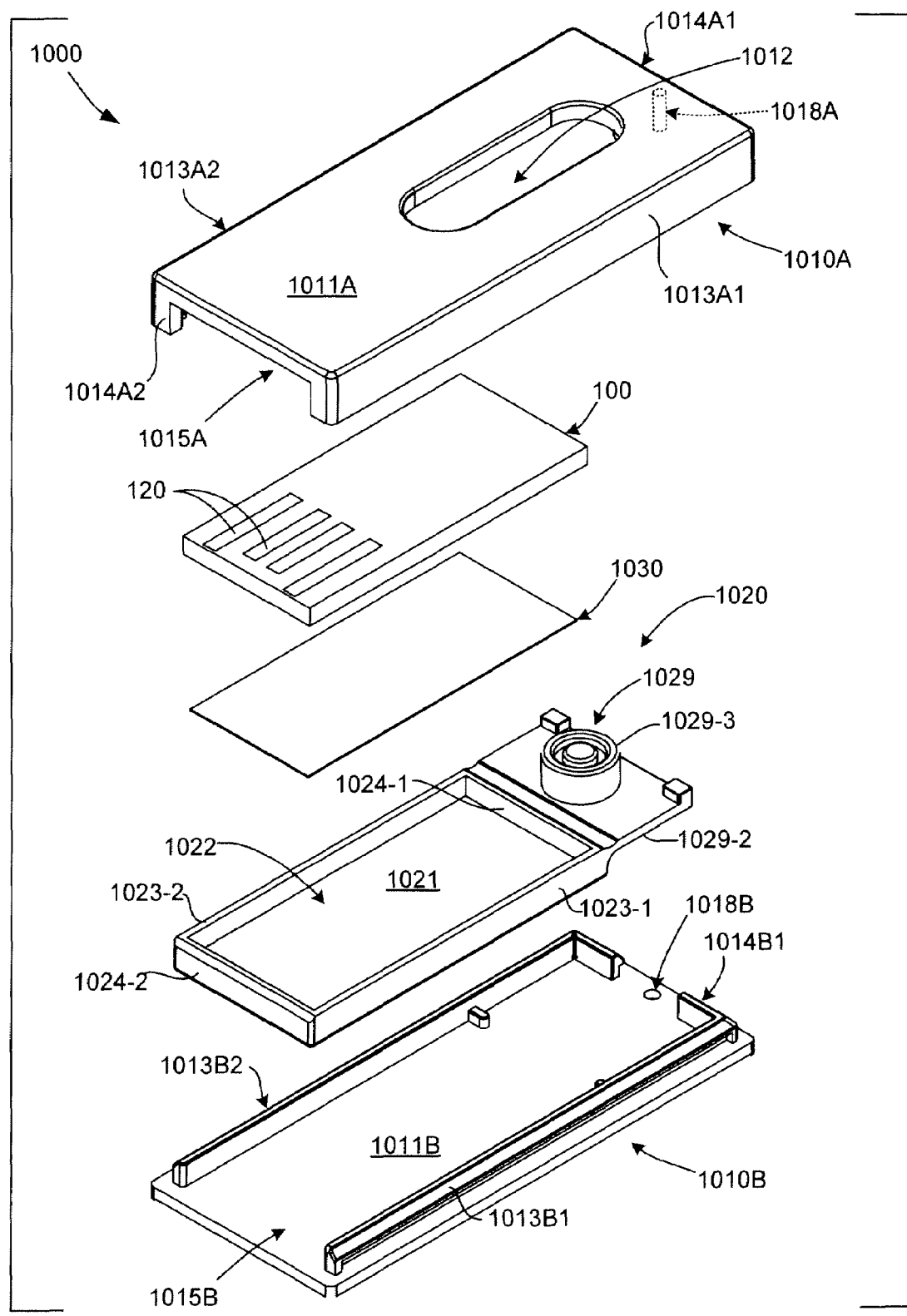
FIGS. 25(A), 25(B), and 25(C) are exploded perspective, front perspective (retracted) and front perspective (deployed) views showing a USB assembly with a modular USB core component disposed in a housing a retractable mechanism according to another embodiment of the present invention.
Figure 25B:
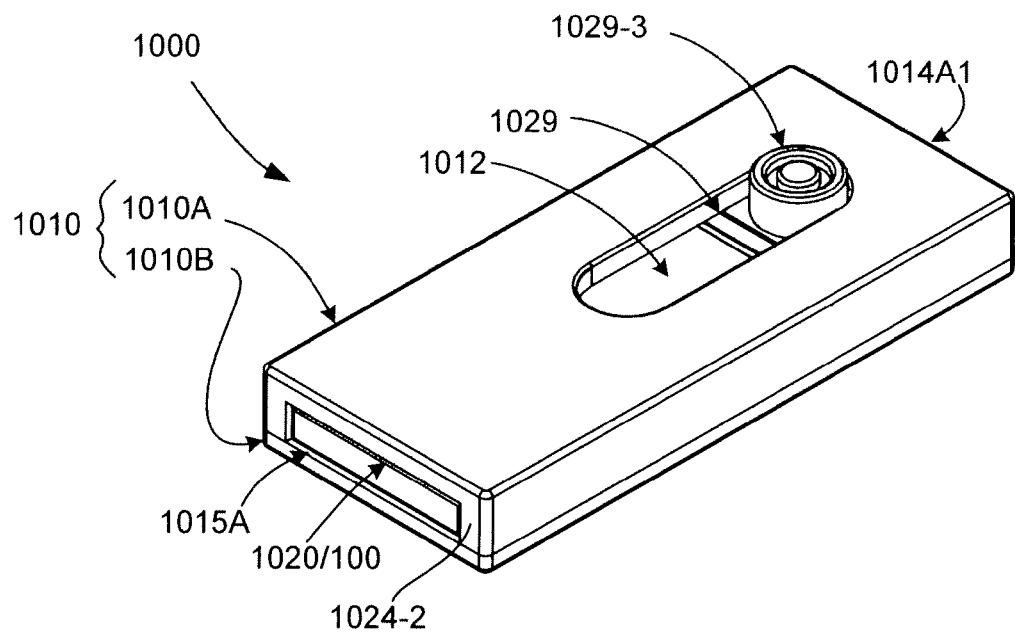
Figure 25C:
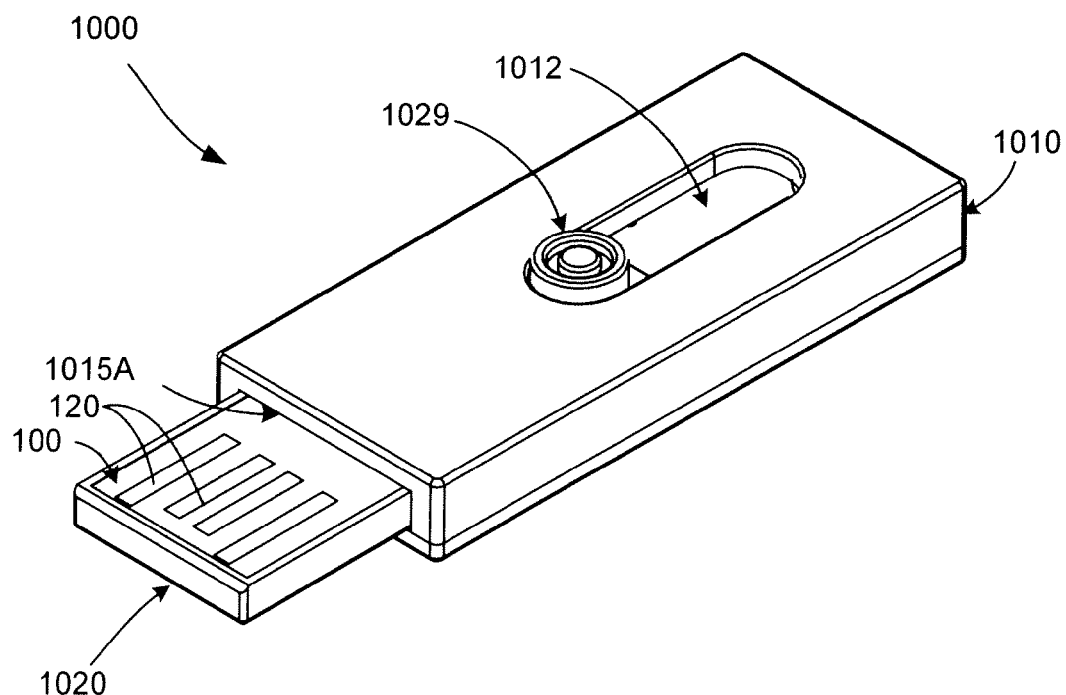

FIGS. 25(A), 25(B) and 25(C) show a USB assembly 1000 according to another embodiment of the present invention. USB assembly 1000 includes an upper housing portion 1010A, a lower housing portion 1010B, a movable holder (retractable mechanism) 1020 for supporting modular USB core component 100, and an adhesive layer 1030.

Upper housing portion 1010A includes an upper wall 1011A, opposing side wall portions 1013A1 and 1013A2, a rear wall 1014A1 and a front wall 1014A2 defining a front opening 1015A similar to that of upper housing portion 710A (see FIG. 21). The inner wall surfaces of upper housing portion 1010A (not shown) include notches that mate with lower housing portion 1010B. In addition, upper housing portion includes an elongated oval upper opening 1012 defined in upper wall 1011A. Upper housing portion also includes a centrally located post structure 1018A that extends downward from upper wall 1011A adjacent to rear wall 1014A1. In one embodiment, upper housing portion 1010A is pre-molded plastic structure.

Lower housing portion 1010B includes a lower wall 1011B, opposing side walls 1013B1 and 1013B2 that define a front opening 1015B, and a rear wall 1014B1 that is divided into two sections separated by a central gap. In one embodiment, housing portion 1010B is made of Zn (zinc) or Al (aluminum) die-casting finished with bright and shinny chromium plating. A receiving hole 1018B is located in the gap separating rear wall portions 1014B1 for receiving an end of post structure 1018A during assembly to form a key chain hole.

Holder 1020 provides a retractable mechanism in cooperation with upper housing portion 1010A and lower housing portion 1010B to facilitate manual deployment and retraction of modular USB core component 100. As indicated in FIG. 25(A), holder 1020 has a lower wall 1021 that is surrounded by peripheral walls (i.e., opposing side walls 1023-1 and 1023-2, a rear wall 1024-1 and a front wall 1024-2), thereby forming a trough 1022 for receiving modular USB core component 100. A resilient structure 1029 includes a horizontal platform 1029-2 that is integrally molded onto rear wall 1024-1 and extends backward therefrom, and a protruding button 1029-3 extending upward from horizontal platform 1029-2.

During assembly, modular USB core component 100 is taped into trough 1022 using double sided adhesive tape 1030. Holder 1020 is then placed in the three sided cavity formed by side walls 1013B1 and 1013B2 and rear wall 1014B of lower housing portion 1010B. Upper housing portion 1010A is then positioned over lower housing portion 1010B and secured by way of snap-coupling ridge-like protrusions extending from side walls 1013B1 and 1013B2 and rear wall 1014B1 into corresponding grooves (not shown) formed on upper housing portion 1010A, and such that resilient structure 1029 extends through upper opening 1012. Holder 1020 and modular USB core component 100 are thus slidably disposed in a cavity defined by upper housing portion 1010A and lower housing portion 1010B.

The completed USB assembly 1000 is shown in FIGS. 25(B) and 25(C). In a retracted position (e.g., as shown in FIG. 25(B)), metal contacts 120 and holder 1020 are disposed inside housing 1010 such that front wall 1024-2 disposed adjacent to front opening 1015A in the manner described above. Conversely, in the deployed position (e.g., as shown in FIG. 25(C)), a front portion of holder 1020 and modular USB core component 100 extend through front opening 1015A such that metal contacts 120 are exposed outside housing 1010 for access by a data terminal (not shown). The deploying and retracting operations are manually performed by pressing and pushing protruding button 1029-3 between the rearmost end of side opening 1012, as shown in FIG. 25(B) and the foremost end of side opening 1012, as shown in FIG. 25(C).

Figure 26A:
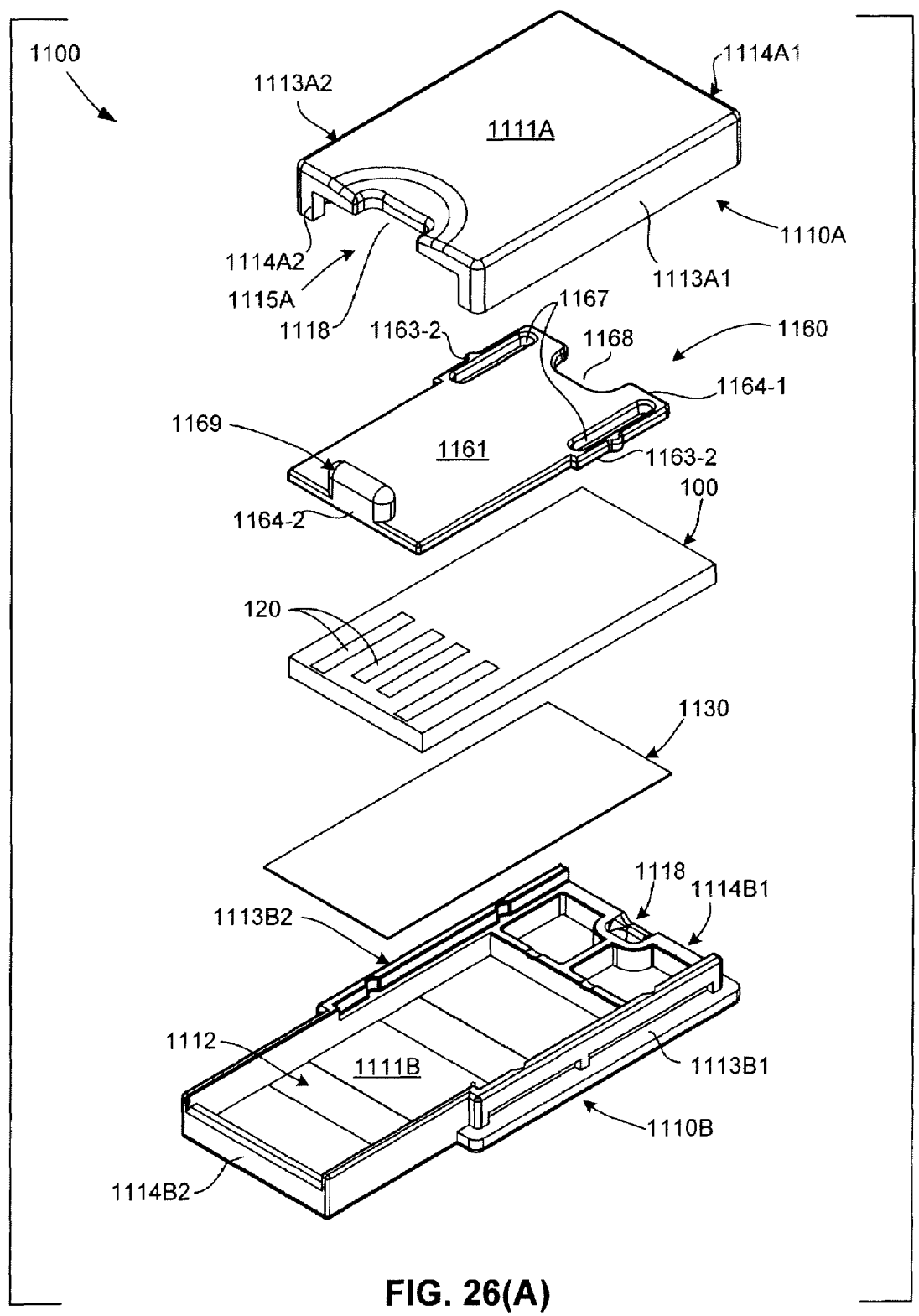
FIGS. 26(A), 26(B) and 26(C) are exploded perspective, front perspective (closed) and front perspective (opened) views showing a USB assembly with a modular USB core component fixedly disposed in a housing including a retractable cover mechanism according to another embodiment of the present invention.
Figure 26B:
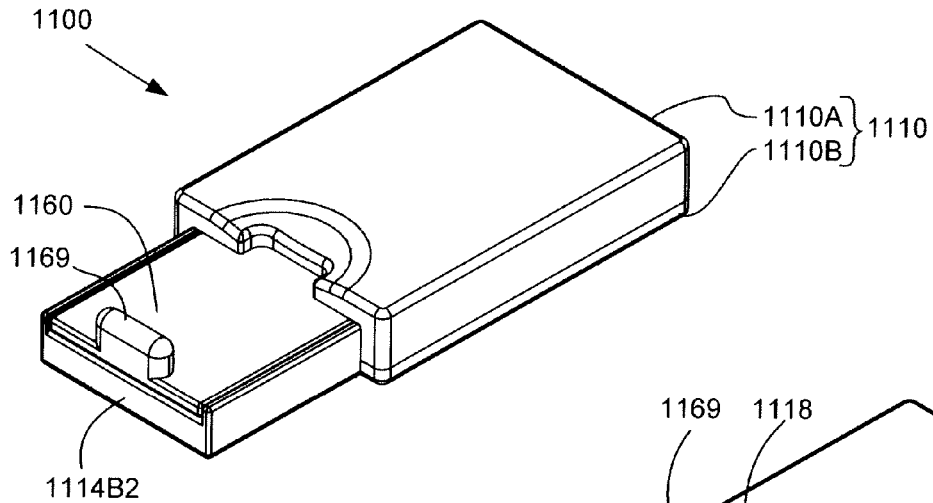
Figure 26C:
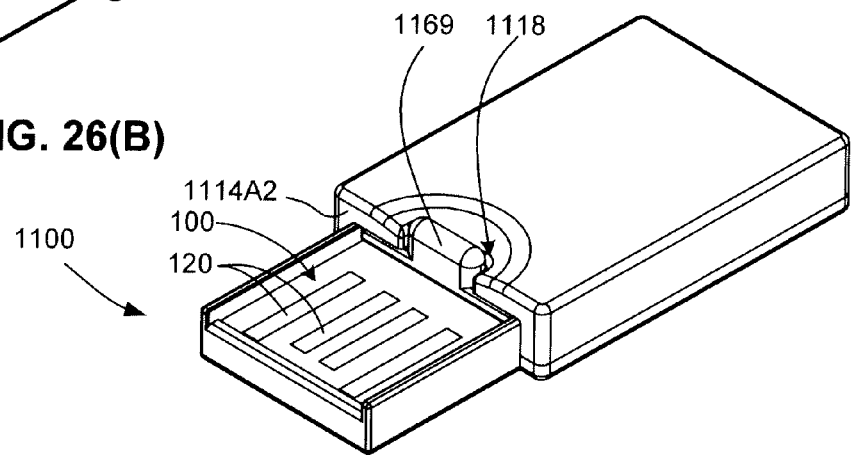

FIGS. 26(A), 26(B) and 26(C) show a USB assembly 1100 according to another embodiment of the present invention. USB assembly 1100 includes an upper housing portion 1110A and a lower housing portion 1110B for supporting modular USB core component 100, a cover plate (retractable mechanism) 1160, and an adhesive layer 1130.

Upper housing portion 1110A includes an upper wall 1111A, opposing side wall portions 1113A1 and 1113A2, a rear wall 1114A1 and a front wall 1114A2 defining a front opening 1115A. The inner wall surfaces of upper housing portion 1110A (not shown) include notches that mate with corresponding structures formed on lower housing portion 1110B. A notch 1118 is defined in an upper central portion of front wall 1114A2. In one embodiment, upper housing portion 1110A is pre-molded plastic structure.

Lower housing portion 1110B includes a lower wall 1111B, opposing side wall portions 1113B1 and 1113B2, a rear wall structure 1114B1 and a front wall 1114B2 that collectively define a cavity 1112. A through hole 1118 is defined adjacent to rear wall structure 1114B1, and serves to receive a key chain. The various structures of lower housing portion 1110B that are depicted in FIG. 26(A) are utilized to secure upper housing portion 1110A by snap-coupling during assembly. In one embodiment, housing portion 1110B is made of Zn (zinc) or Al (aluminum) die-casting finished with bright and shinny chromium plating.

Cover plate 1160 provides a retractable mechanism in cooperation with upper housing portion 1110A and lower housing portion 1110B to facilitate manual access to modular USB core component 100. As indicated in FIG. 26(A), cover plate 1160 includes a wall 1161 having side edges 1163-1 and 1163-2, a rear edge 1164-1 and a front edge 1164-2). Guide grooves 1167 are defined along rear portions of side edges 1163-1 and 1163-2, respectively, and are received into tracks (not shown) that are formed on the inner surfaces of upper housing portion 1110A. A backend recess 1168 formed along back edge 1164-1 to facilitate the mounting of a key chain through opening 1118 of lower housing portion 1110B. A 1169 extends upward from wall 1161 adjacent front edge 1164-2, and serves to facilitate manual operation of cover plate 1160.

During assembly, modular USB core component 100 is taped into the trough 1112 using double sided adhesive tape 1130. Cover plate 1160 is then placed over modular USB core component 100, and upper housing portion 1110A is then positioned over lower housing portion 1110B and secured by way of snap-coupling ridge-like protrusions extending from side walls 1113B1 and 1113B2 and rear wall 1114B1 into corresponding grooves (not shown) formed on upper housing portion 1110A, and such that at least a portion of cover plate 1160 extends through front opening 1115A. Cover plate 1160 is thus slidably connected to upper housing portion 1110A and lower housing portion 1110B.

The completed USB assembly 1100 is shown in FIGS. 26(B) and 26(C), where cover plate 1160 is disposed in housing 1110 (formed by upper housing portion 1110A and lower housing portion 1110B) such that cover plate 1160 is slidable between a closed position (FIG. 26(B)), in which cover plate 1160 is disposed over metal contacts 120 of modular USB core component 100, and an open position (FIG. 26(C)), in which cover plate 1160 is disposed inside housing 1110 (button 1169 is received in notch 1118) and metal contacts 120 are exposed for access by the data terminal (not shown). The closing and opening operations are manually performed by pushing/pulling switch button 1169 between front wall 1114A2 to of upper housing 1110A, as shown in FIG. 26(B) and front wall 1114B2 of lower housing portion 1110B, as shown in FIG. 26(C).

Figure 27:
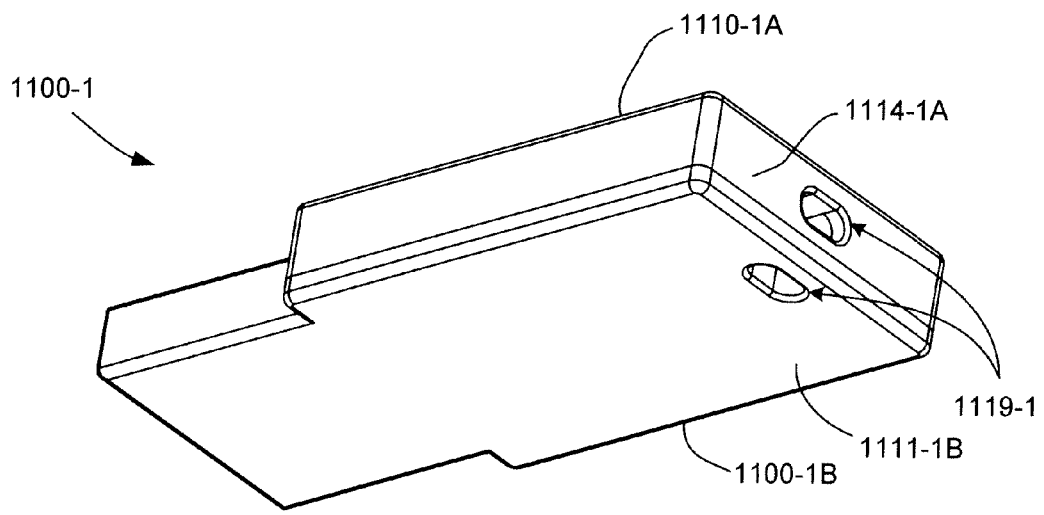
FIG. 27 is a rear bottom perspective view showing the USB assembly of FIG. 26(A)

FIG. 27 shows a USB assembly 1100-1 according to another embodiment of the present invention. USB assembly 1100A differs from USB assembly 1100 (FIG. 26) in that a key chain opening 1119-1 is formed between a rear wall 1114-1A of upper housing portion 1110-1A and a lower wall 1111-1B of lower housing portion 1110-1B, whereby no part of key chain opening 1119-1 is visible on the upper surfaces of USB assembly 1100-1.

Figure 28A:
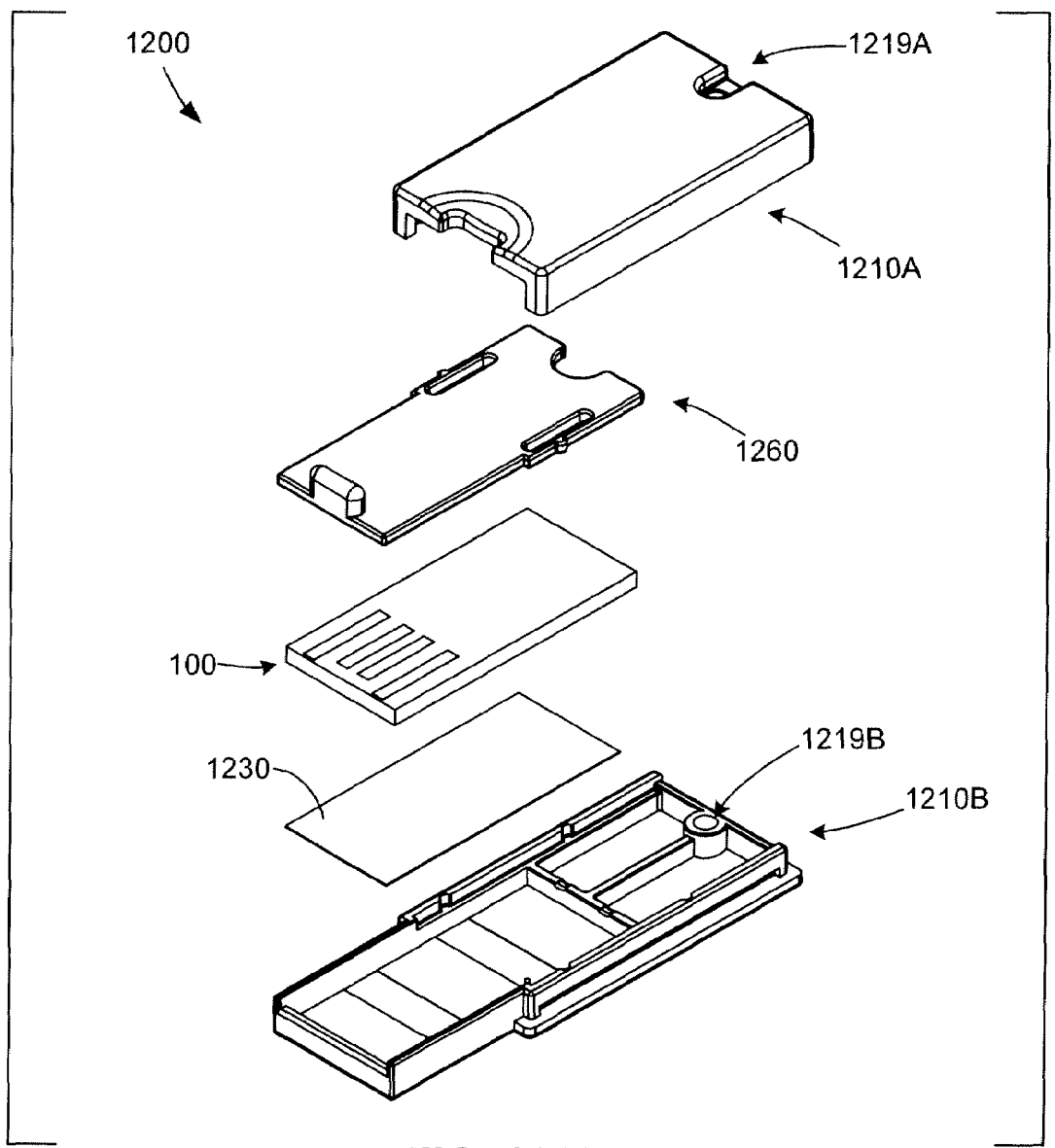
FIGS. 28(A) and 28(B) are exploded perspective and front perspective (opened) views showing a USB assembly with a modular USB core component fixedly disposed in a housing including a retractable cover mechanism according to another embodiment of the present invention.
Figure 28B:
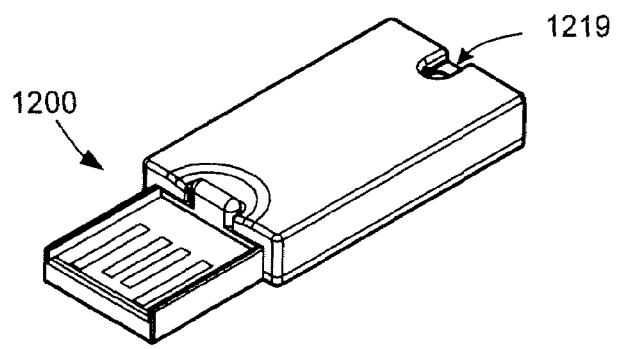

FIGS. 28(A) and 28(B) show a USB assembly 1200 according to another embodiment of the present invention. USB assembly 1200 includes an upper housing portion 1210A, a lower housing portion 1210B, modular USB core component 100, a cover plate 1260, and an adhesive layer 1230 that are substantially identical to corresponding structures of USB assembly 1100, which is described above with reference to FIG. 26(A). However, USB assembly 1200 differs from USB assembly 1100 in that a key chain opening 1219A is disposed through an upper surface of upper housing portion 1210A that is aligned with a corresponding key chain opening disposed on lower housing portion 1210B, and these openings combine to provide a key chain through hole 1219, which is shown in FIG. 28(B).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A low-profile USB assembly adapted to be retractably accessed by a data terminal, said USB assembly comprising:
    a modular USB core component comprising:
        a printed circuit board assembly (PCBA) including:
            a card body,
            a non-volatile memory device mounted on the card body,
            a card reader interface circuit mounted on said card body, and
            a processing unit mounted on said card body and connected to said non-volatile memory device and said card reader interface circuit,
            wherein said card body comprises a printed circuit board (PCB) having opposing first and second surfaces, a plurality of metal contacts disposed on the first surface, at least one passive component mounted on the second surface,
            wherein at least one of the non-volatile memory device, the card reader interface circuit and the processing unit comprises an unpackaged integrated circuit (IC) die mounted on the second surface of the PCB handle section, and
            wherein a plurality of conductive traces are formed on the PCB such that each conductive trace is electrically connected to at least one of an associated metal contact, the IC die and the passive component; and
        a single-piece molded housing formed on the second surface of the PCBA such that said at least one passive component and said at least one IC die are covered by said molded housing, and such that substantially all of the first surface of the PCB is exposed; and
    a housing disposed around at least a portion of the modular USB core component such that the metal contacts are disposed adjacent to a front opening defined in the housing; and
    retractable means slidably connected to the housing and manually movable between a first position in which the metal contacts are covered by a wall, and a second position in which the metal contacts are exposed for access by the data terminal.

2. The low-profile USB assembly according to claim 1,
    wherein said retractable means comprises a holder that is disposed in the housing, the holder having peripheral walls surrounding a trough, the peripheral walls including a front wall disposed adjacent to the second opening,
    wherein the modular USB core component is fixedly received in the trough of the holder such that the metal contacts are disposed adjacent to the front wall, and
    wherein the holder is slidable within the housing between a retracted position, in which the front wall of the holder blocks the front opening of the housing and a wall of the housing covers the metal contacts of the modular USB core component, and a deployed position, in which a front portion of the holder is extended through the front opening of the housing such that the metal contacts of the modular USB core component are exposed for access by the data terminal.

3. The low-profile USB assembly of claim 2, wherein the housing comprises a lower housing portion and an upper housing portion mounted on the lower case portion, and wherein the holder comprises a single-piece, pre-molded plastic structure that is slidably disposed in a cavity defined by the upper housing portion and the lower housing portion.

4. The low-profile USB assembly of claim 3, wherein said upper housing portion is snap-coupled to said lower housing portion.

5. The low-profile USB assembly of claim 3,
    wherein the housing includes opposing upper and lower walls, and opposing first and second side walls extending between the upper wall and the lower wall, and
    wherein the holder further comprises a protruding button extending through an opening defined in one of said upper wall, said lower wall, said first side wall and said second side wall of the housing.

6. The low-profile USB assembly of claim 5, wherein the protruding button comprises a resilient structure disposed such that the protruding button is biased out of said opening.

7. The low-profile USB assembly of claim 6, wherein the housing further comprises a locking groove defined inside of the cavity, and
    wherein the resilient structure includes a locking protrusion that is slidably engaged in the locking groove.

8. The low-profile USB assembly of claim 3, wherein at least one of the lower housing portion and the upper housing portion in include a corner structure defining a key chain hole adjacent to a corner of said housing.

9. The low-profile USB assembly of claim 3, wherein at least one of the lower housing portion and the upper housing portion in include a post structure defining a key chain hole disposed adjacent to center of a rear wall of said housing.

10. The low-profile USB assembly of claim 1,
wherein the modular USB core component is fixedly received in the housing such that the metal contacts are disposed adjacent to the front wall, and
wherein said retractable means comprises a cover plate that is slidably disposed in the housing such that the cover plate is slidable between a closed position, in which the cover plate is disposed over the metal contacts of the modular USB core component, and an open position, in which the cover plate is disposed inside the housing and the metal contacts of the modular USB core component are exposed for access by the data terminal.

11. The low-profile USB assembly of claim 10, wherein the cover plate includes a switch button extending from the cover plate and disposed outside the housing.

12. The low-profile USB assembly of claim 10, wherein the housing includes a through hole defined in a rear wall of the housing for receiving a key chain.

13. The low-profile USB assembly of claim 1, wherein the at least one integrated circuit (IC) die is electrically connected to the conductive traces by a plurality of wire bonds extending between said at least one IC die and corresponding contact pads disposed on the second surface of the PCB.

14. The low-profile USB assembly of claim 13, wherein the at least one passive component includes a lead that is soldered to a corresponding contact pad disposed on the second surface of the PCB.

15. The low-profile USB assembly of claim 14, wherein the at least one passive component comprises at least one of a resistor, a capacitor, an oscillator, and a light emitting diode.

16. The low-profile USB assembly of claim 13, wherein the at least one integrated circuit (IC) die includes a first IC die comprising an USB controller circuit, and a second IC die comprising a flash memory circuit.

17. The low-profile USB assembly of claim 16, wherein the at least one IC die comprises a plurality of flash memory dies disposed in a stacked arrangement such that a first flash memory die is mounted on the second surface of the PCB, and a second flash memory die is mounted on a surface of the first flash memory die.

18. The low-profile USB assembly of claim 17, wherein the first flash memory die is connected to said PCB by a first plurality of said wire bonds, and the second flash memory die is connected to one of the first flash memory die and said PCB by a second plurality of wire bonds.

19. The low-profile USB assembly of claim 13, wherein the at least one integrated circuit (IC) die includes a single-chip controller/flash die comprising controller circuit and one or more flash block mass storage circuits that are interconnected by a bus.

20. A method for producing an USB assembly comprising:
producing a modular USB core component including:
a PCBA including:
a card body,
a non-volatile memory device mounted on the card body,
a card reader interface circuit mounted on said card body, and
a processing unit mounted on said card body and connected to said non-volatile memory device and said card reader interface circuit,
wherein said card body comprises a printed circuit board (PCB) having opposing first and second surfaces, a plurality of metal contacts disposed on the first surface, at least one passive component mounted on the second surface,
wherein at least one of the non-volatile memory device, the card reader interface circuit and the processing unit comprises an unpackaged integrated circuit (IC) die mounted on the second surface of the PCB handle section, and
wherein a plurality of conductive traces are formed on the PCB such that each conductive trace is electrically connected to at least one of an associated metal contact, the IC die and the passive component; and
a single-piece molded housing formed on the second surface of the PCBA such that said at least one passive component and said at least one IC die are covered by said molded housing, and such that substantially all of the first surface of the PCB is exposed; and; and
mounting said modular USB core component into a housing including a retractable mechanism that is slidably connected to the housing and manually movable between a first position in which the metal contacts are covered by a wall, and a second position in which the metal contacts are exposed for access by the data terminal.

* * * * *